United States Patent
Jung

(10) Patent No.: US 9,722,582 B2
(45) Date of Patent: Aug. 1, 2017

(54) SEMICONDUCTOR DEVICE WITH OUTPUT DRIVER PRE-EMPHASIS SCHEME

(71) Applicant: SK hynix Inc., Gyeonggi-do (KR)

(72) Inventor: Hae-Kang Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/189,899

(22) Filed: Jun. 22, 2016

(65) Prior Publication Data

US 2016/0301393 A1 Oct. 13, 2016

Related U.S. Application Data

(63) Continuation-in-part of application No. 14/527,617, filed on Oct. 29, 2014, now Pat. No. 9,391,594.

(30) Foreign Application Priority Data

May 21, 2014 (KR) .......................... 10-2014-0060741

(51) Int. Cl.
 *H03K 3/012* (2006.01)
 *H03K 17/16* (2006.01)
 *H03K 19/0185* (2006.01)
 *H03K 19/094* (2006.01)
 *H04L 25/00* (2006.01)

(52) U.S. Cl.
 CPC .............. *H03K 3/012* (2013.01); *H03K 17/16* (2013.01); *H03K 19/018521* (2013.01); *H03K 19/018585* (2013.01); *H03K 19/094* (2013.01); *H04L 25/00* (2013.01)

(58) Field of Classification Search
 CPC ..... H03K 19/01707; H03K 19/018521; H03K 17/162; H03K 17/6871; H03K 19/017545; H03K 19/018585; H03K 19/096; H03K 19/1737; H03K 5/1515; H03K 19/018514
 USPC .......................... 327/108, 109, 110, 111, 112
 See application file for complete search history.

(56) References Cited

U.S. PATENT DOCUMENTS 8,410,818 B1 * 4/2013 Hsu .................... H03K 19/0013
 326/27

* cited by examiner

*Primary Examiner* — John Poos
(74) *Attorney, Agent, or Firm* — IP & T Group LLP

(57) ABSTRACT

A semiconductor device includes: a pre-emphasis control signal generation block suitable for generating first and second pre-emphasis control signals for controlling a pre-emphasis operation; at least one first output driver suitable for being selectively enabled in response to a selection code signal and driving a pad in response to a first output signal; and at least one second output driver suitable for being selectively enabled in response to the selection code signal and the first pre-emphasis control signal, performing the pre-emphasis operation with a driving force corresponding to a calibration code signal, and performing the pre-emphasis operation with a maximum driving force in response to the second pre-emphasis control signal.

18 Claims, 18 Drawing Sheets

SEMICONDUCTOR DEVICE WITH OUTPUT DRIVER PRE-EMPHASIS SCHEME

CROSS-REFERENCE TO RELATED APPLICATIONS

This application is a continuation-in-part of U.S. patent application Ser. No. 14/527,617 filed on Oct. 29, 2014, which claims priority of Korean Patent Application No. 10-2014-0060741, filed on May 21, 2014. The disclosure of each of the foregoing applications is incorporated herein by reference in its entirety.

BACKGROUND

1. Field

Various exemplary embodiments of the present invention relate to a semiconductor design technology, and more particularly, to a semiconductor device including an output driver.

2. Description of the Related Art

In general, when a semiconductor device exchanges a signal with an external device, noise occurs due to an impedance mismatch between the semiconductor device and the external device during the signal exchange. Particularly, the noise causes Inter-Symbolic Interference (ISI), and thus the signal cannot fully swing between a power source voltage level and a ground voltage level, and the signal becomes distorted.

To prevent this problem, a pre-emphasis circuit is applied to the semiconductor device. The pre-emphasis circuit is connected in parallel to a pad together with an output driver. The pre-emphasis circuit improves timing margin of a signal, which is outputted from the output driver, when the signal transitions.

However, an additional area for the pre-emphasis circuit is required in the semiconductor device since the pre-emphasis circuit is a separate component. Also, it is hard to perform a high-speed operation because parasitic capacitance and parasitic resistance, caused by the pre-emphasis circuit, are reflected into the pad.

SUMMARY

Exemplary embodiments of the present invention are directed to a semiconductor device including a pre-emphasis circuit having minimum composition.

In accordance with an embodiment of the present invention, a semiconductor device includes: a pre-emphasis control signal generation portion suitable for generating a pre-emphasis control signal for a pre-emphasis operation; and a plurality of output drivers, a portion of which performs the pre-emphasis operation based on the pre-emphasis control signal when an output operation is performed.

The output drivers may include: one or more first output drivers operable according to a selection code signal, and suitable for driving a pad in response to a first output signal; and one or more second output drivers which are selectively enabled in response to the selection code signal and the pre-emphasis control signal and drive the pad in response to a second output signal.

In accordance with another embodiment of the present invention, a semiconductor device includes: one or more first output drivers suitable for driving a pad with a first driving power regardless of whether a pre-emphasis operation is performed; and one or more second output drivers suitable for driving the pad with a second driving power based on whether the pre-emphasis operation is performed.

In accordance with another embodiment of the present invention, a semiconductor device includes: one or more first pull-up output drivers selectively operable according to a first pull-up selection code signal, and suitable for driving a pad in response to a first output signal; a first selection block suitable for outputting one between the first output signal and a first pre-emphasis signal as a second output signal in response to a first pull-up pre-emphasis control signal; one or more second pull-up output drivers selectively operable according to a second pull-up selection code signal and the first pull-up pre-emphasis control signal and suitable for driving the pad in response to the second output signal; a first pre-emphasis enabling block suitable for generating the first pre-emphasis signal, which is enabled during a rising time of the first output signal; one or more first pull-down output drivers selectively operable according to a first pull-down selection code signal, and suitable for driving a pad in response to the first output signal; a second selection block suitable for outputting one between the first reverse output signal and a second pre-emphasis signal as a third output signal in response to a first pull-down pre-emphasis control signal; one or more second pull-down output drivers selectively operable according to a second pull-down selection code signal and the first pull-down pre-emphasis control signal, and suitable for driving the pad in response to the third output signal; and a second pre-emphasis enabling block suitable for generating the second pre-emphasis signal, which is enabled during a falling time of the first output signal.

In accordance with another embodiment of the present invention, a semiconductor device includes: a pre-emphasis control signal generation block suitable for generating first and second pre-emphasis control signals for controlling a pre-emphasis operation; at least one first output driver suitable for being selectively enabled in response to a selection code signal and driving a pad in response to a first output signal; and at least one second output driver suitable for being selectively enabled in response to the selection code signal and the first pre-emphasis control signal, performing the pre-emphasis operation with a driving force corresponding to a calibration code signal, and performing the pre-emphasis operation with a maximum driving force in response to the second pre-emphasis control signal.

In accordance with another embodiment of the present invention, a semiconductor device includes: a pre-emphasis control signal generation block suitable for generating a pre-emphasis control signal; and a plurality of output drivers suitable for being selectively enabled in response to selection code signals corresponding thereto among a plurality of selection code signals, and performing an output operation and a pre-emphasis operation together in the case where the pre-emphasis control signal is enabled.

In accordance with another embodiment of the present invention, a semiconductor device includes: a pre-emphasis control signal generation block suitable for generating first and second pre-emphasis control signals; a plurality of pull-up output drivers suitable for being selectively enabled in response to pull-up selection code signals corresponding thereto among a plurality of pull-up selection code signals, and performing a pull-up output operation and a pull-up pre-emphasis operation together in the case where the first pre-emphasis control signal is enabled; and a plurality of pull-down output drivers suitable for being selectively enabled in response to pull-down selection code signals corresponding thereto among a plurality of pull-down selection code signals, and performing a pull-down output operation and a pull-down pre-emphasis operation together in the case where the second pre-emphasis control signal is enabled.

DETAILED DESCRIPTION

Exemplary embodiments of the present invention are described below in more detail with reference to the accompanying drawings. These embodiments are provided so that this disclosure is thorough and complete and fully conveys the scope of the present invention to those skilled in the art.

Figure 1:
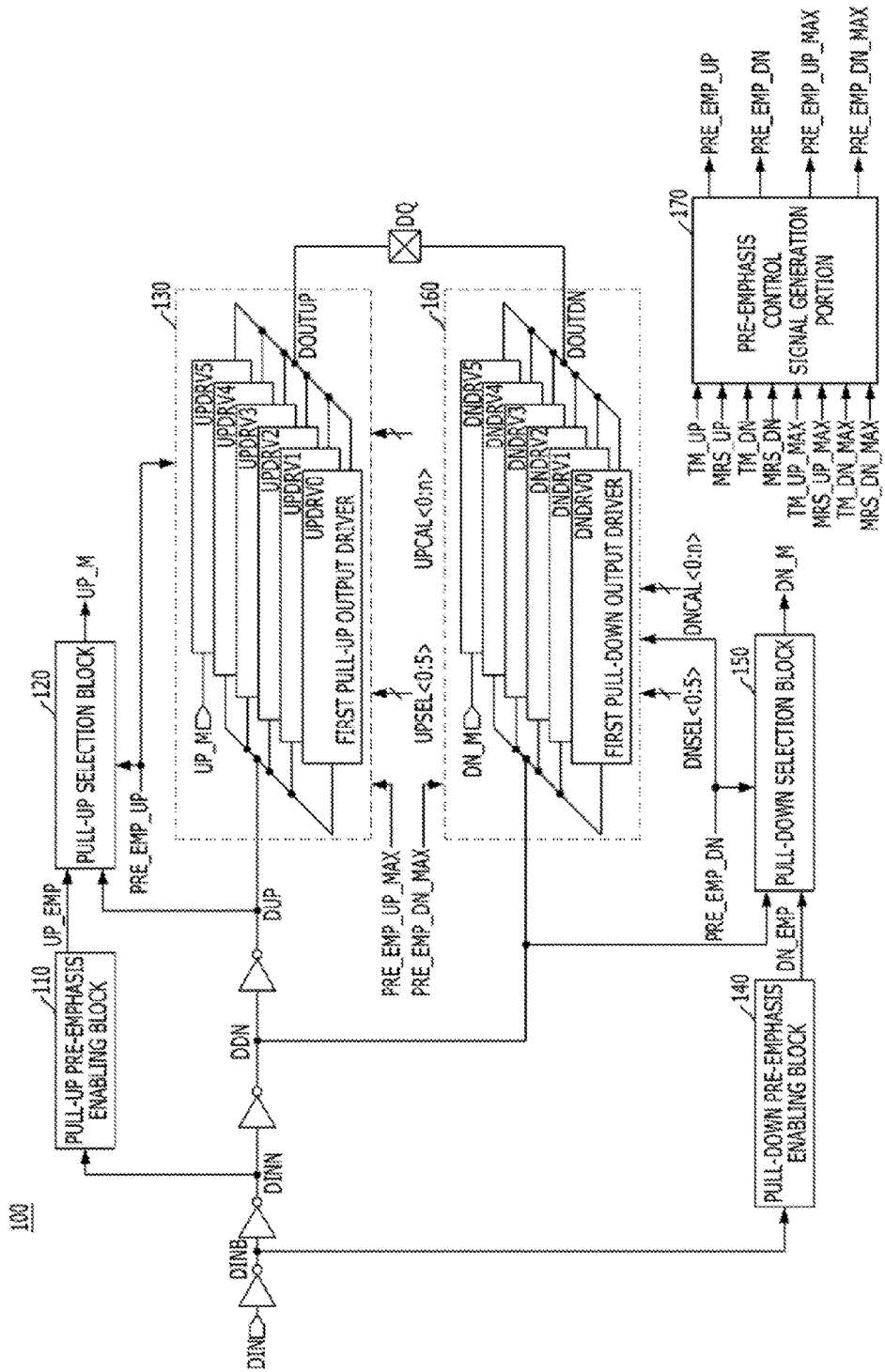
FIG. 1 is a block diagram illustrating a semiconductor device in accordance with an embodiment of the present invention.

FIG. 1 is a block diagram illustrating a semiconductor device 100 in accordance with an embodiment of the present invention.

Referring to FIG. 1, the semiconductor device 100 may include pull-up circuits 110 to 130, pull-down circuits 140 to 160, and a control signal generation portion 170.

The pull-up circuits 110 to 130 drive a pad DQ with a high voltage VDD in response to first and second pull-up pre-emphasis control signals PRE_EMP_UP and PRE_EMP_UP_MAX, and a first internal signal DINN having the same phase as an internal data signal DIN.

The pull-down circuits 140 to 160 drive the pad DQ with a low voltage VSS in response to first and second pull-down pre-emphasis control signals PRE_EMP_DN and PRE_EMP_DN_MAX, and a second internal signal DINB having a reverse phase of the internal data signal DIN.

The control signal generation portion 170 generates the first and second pull-up pre-emphasis control signals PRE_EMP_UP and PRE_EMP_UP_MAX, and the first and second pull-down pre-emphasis control signals PRE_EMP_DN and PRE_EMP_DN_MAX in response to first to fourth test mode signals TM_UP, TM_DN, TM_UP_MAX and TM_DN_MAX, and first to fourth Mode Register Set (MRS) signals MRS_UP, MRS_DN, MRS_UP_MAX and MRS_DN_MAX.

The pull-up circuits 110 to 130 may include a pull-up pre-emphasis enabling block 110, a pull-up selection block 120 and a pull-up output driving circuit block 130.

The pull-up pre-emphasis enabling block 110 detects an edge of the first internal signal DINN and generates a first pre-emphasis signal UP_EMP corresponding to the detection result.

The pull-up selection block 120 selects one signal as a pull-up signal UP_M among a first internal output signal DUP and the first pre-emphasis signal UP_EMP in response to the first pull-up pre-emphasis control signal PRE_EMP_UP.

The pull-up output driving circuit block 130 outputs a pull-up output signal DOUTUP corresponding to the first internal output signal DUP to the pad DQ in response to first to sixth pull-up selection code signals UPSEL<0:5> and a plurality of pull-up calibration code signals UPCAL<0:n>. The first internal output signal DUP may have the same phase as the first internal signal DINN.

The pull-up pre-emphasis enabling block 110 may enable the first pre-emphasis signal UP_EMP during a predetermined section corresponding to a rising edge of the first internal signal DINN. The predetermined section may be smaller than 1 Unit Interval (UI) of the first internal signal DINN. For example, the pull-up pre-emphasis enabling block 110 may include a pulse generator. Although not shown in the drawing, the pull-up pre-emphasis enabling block 110 may be enabled or disabled in response to the first pull-up pre-emphasis control signal PRE_EMP_UP.

The pull-up selection block 120 may output the first pre-emphasis signal UP_EMP as the pull-up signal UP_M when the first pull-up pre-emphasis control signal PRE_EMP_UP is enabled, and may output the first internal output signal DUP as the pull-up signal UP_M when the first pull-up pre-emphasis control signal PRE_EMP_UP is disabled.

Figure 2:
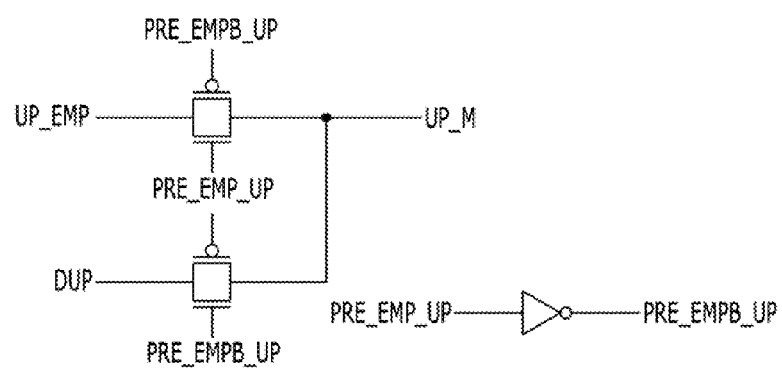
FIG. 2 is a circuit diagram illustrating a pull-up selection block shown in FIG. 1.

FIG. 2 is a circuit diagram illustrating the pull-up selection block 120 shown in FIG. 1.

Referring to FIG. 2, the pull-up selection block 120 may include first and second transmission gates. The first transmission gate selectively transfers the first pre-emphasis signal UP_EMP as the pull-up signal UP_M in response to the first pull-up pre-emphasis control signal PRE_EMP_UP and a first reverse control signal PRE_EMPB_UP. The first reverse control signal PRE_EMPB_UP is a reverse signal of the first pull-up pre-emphasis control signal PRE_EMP_UP. The second transmission gate selectively transfers the first internal output signal DUP as the pull-up signal UP_M in response to the first pull-up pre-emphasis control signal PRE_EMP_UP and the first reverse control signal PRE_EMPB_UP.

Referring back to FIG. 1, the pull-up output driving circuit block 130 may include first to sixth pull-up output drivers UPDRV0 to UPDRV5 connected in parallel to the pad DQ.

The first to sixth pull-up output drivers UPDRV0 to UPDRV5 may be enabled or disabled based on the first to sixth pull-up selection code signals UPSEL<0:5>, which are for controlling on-resistance Ron of the pull-up output driving circuit block 130 in order to secure signal integrity in diverse system conditions, e.g., a channel condition.

For example, when each of the pull-up output drivers UPDRV0 to UPDRV5 has the on-resistance of approximately 240 ohm and the first to sixth pull-up output drivers UPDRV0 to UPDRV5 are enabled, the pull-up output driving circuit block 130 may have an on-resistance of approximately 40 ohm, which is obtained by dividing approximately 240 ohm by 6. When the first to fifth pull-up output drivers UPDRV0 to UPDRV4 are enabled, the pull-up output driving circuit block 130 may have an on-resistance of approximately 48 ohm, which is obtained by dividing approximately 240 ohm by 5. When the first to fourth pull-up output drivers UPDRV0 to UPDRV3 are enabled, the pull-up output driving circuit block 130 may have an on-resistance of approximately 60 ohm, which is obtained by dividing approximately 240 ohm by 4. When the first to third pull-up output drivers UPDRV0 to UPDRV2 are enabled, the pull-up output driving circuit block 130 may have an on-resistance of approximately 80 ohm, which is obtained by dividing approximately 240 ohm by 3. When the first and second pull-up output drivers UPDRV0 and UPDRV1 are enabled, the pull-up output driving circuit block 130 may have an on-resistance of approximately 120 ohm, which is obtained by dividing approximately 240 ohm by 2. When just the first pull-up output driver UPDRV0 is enabled, the pull-up output driving circuit block 130 may have an on-resistance of approximately 240 ohm, which is obtained by dividing approximately 240 ohm by 1. Herein, all the first to sixth pull-up output drivers UPDRV0 to UPDRV5 may be enabled for a maximum driving power having full strength.

The first to fifth pull-up output drivers UPDRV0 to UPDRV4 may drive the pad DQ with the high voltage in response to the first internal output signal DUP, and the sixth pull-up output driver UPDRV5 may drive the pad DQ with the high voltage in response to the pull-up signal UP_M. In the embodiment of the present invention, it is described as an example that the sixth pull-up output driver UPDRV5 performs the pre-emphasis operation when the first to fifth pull-up output drivers UPDRV0 to UPDRV4 perform an output operation. A detailed description on the first to sixth pull-up output drivers UPDRV0 to UPDRV5 is provided hereafter.

Figure 3:
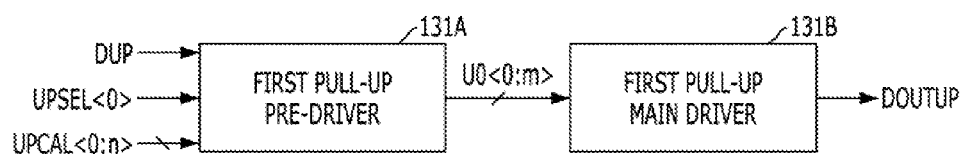
FIG. 3 is a block diagram illustrating a first pull-up output driver shown in FIG. 1.
Figure 4A:
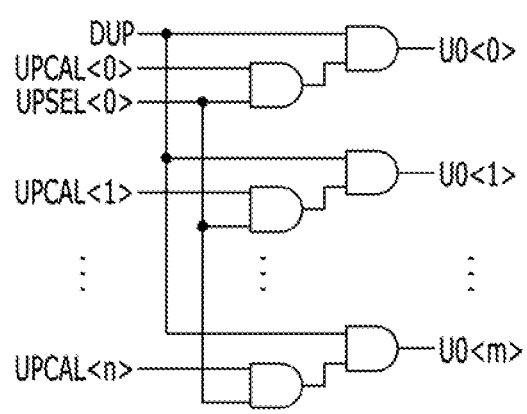
FIG. 4A is a circuit diagram illustrating a first pull-up pre-driver shown in FIG. 3.
Figure 4B:
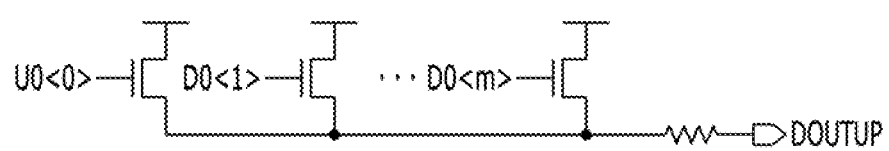
FIG. 4B is a circuit diagram illustrating a first pull-up main driver shown in FIG. 3.

FIG. 3 is a block diagram illustrating the first pull-up output driver UPDRV0 shown in FIG. 1. FIG. 4A is a circuit diagram illustrating a first pull-up pre-driver 131A shown in FIG. 3. FIG. 4B is a circuit diagram illustrating a first pull-up main driver 131B shown in FIG. 3.

Referring to FIG. 3, the first pull-up output driver UPDRV0 may include the first pull-up pre-driver 131A and the first pull-up main driver 131B. The first pull-up pre-driver 131A generates a plurality of first pull-up control code signals U0<0:m> in response to the first internal output signal DUP, the first pull-up selection code signal UPSEL<0> and the pull-up calibration code signals UPCAL<0:n>. The first pull-up main driver 131B drives the pad DQ with the high voltage in response to the first pull-up control code signals U0<0:m>. Herein, n may be equal to m or not.

For example, as illustrated in FIG. 4A, the first pull-up pre-driver 131A may disable all the first pull-up control code signals U0<0:m> regardless of the pull-up calibration code signals UPCAL<0:n> when the first internal output signal DUP and the first pull-up selection code signal UPSEL<0> are disabled to a logic low level. The first pull-up pre-driver 131A may selectively enable the first pull-up control code signals U0<0:m> based on the pull-up calibration code signals UPCAL<0:n> when the first internal output signal DUP and the first pull-up selection code signal UPSEL<0> are enabled to a logic high level.

As illustrated in FIG. 4B, the first pull-up main driver 131B may include a plurality of NMOS transistors for driving the pad DQ with the high voltage in response to the first pull-up control code signals U0<0:m>. In other words, the NMOS transistors may be connected in parallel between a high voltage and the pad DQ, and the first pull-up control code signals U0<0:m> may be inputted to gates of the NMOS transistors, respectively.

Each of the second to fifth pull-up output drivers UPDRV1 to UPDRV4 are the same as the first pull-up output driver UPDRV0 except that the first pull-up selection code signal UPSEL<0> is inputted to the first pull-up output driver UPDRV0 whereas the second to fifth pull-up selection code signals UPSEL<1:4> are inputted to the second to fifth pull-up output drivers UPDRV1 to UPDRV4, respectively.

Figure 5:
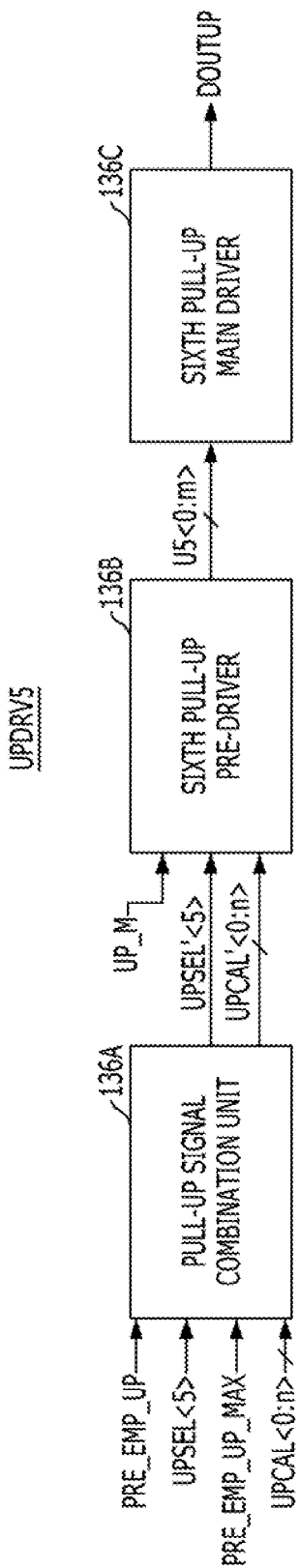
FIG. 5 is a block diagram illustrating a sixth pull-up output driver shown in FIG. 1.
Figure 6A:
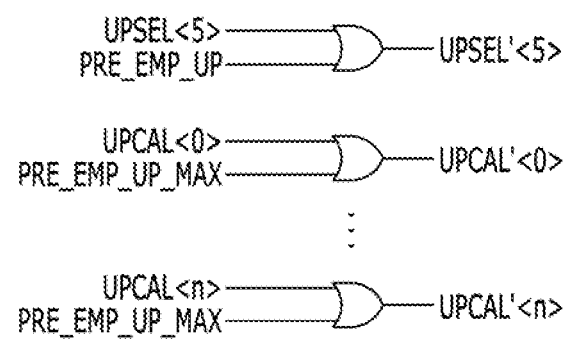
FIG. 6A is a circuit diagram illustrating a pull-up signal combination unit shown in FIG. 5.
Figure 6B:
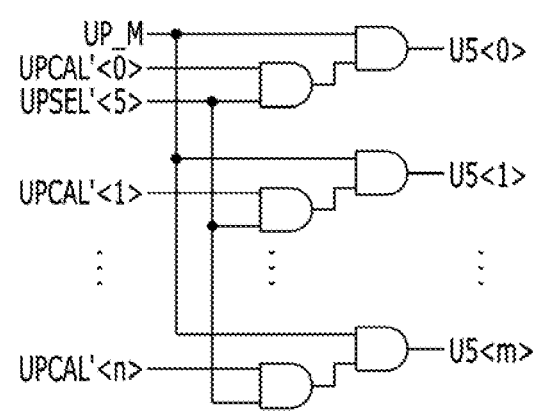
FIG. 6B is a circuit diagram illustrating a sixth pull-up pre-driver shown in FIG. 5.
Figure 6C:
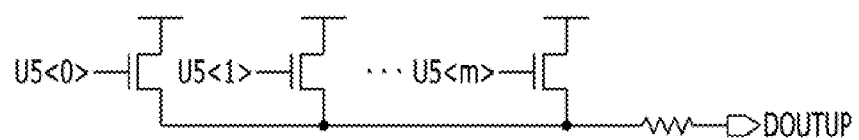
FIG. 6C is a circuit diagram illustrating a sixth pull-up main driver shown in FIG. 5.

FIG. 5 is a block diagram illustrating the sixth pull-up output driver UPDRV5. FIG. 6A is a circuit diagram illustrating a pull-up signal combination unit 136A shown in FIG. 5. FIG. 6B is a circuit diagram illustrating a sixth pull-up pre-driver 136B shown in FIG. 5. FIG. 6C is a circuit diagram illustrating a sixth pull-up main driver 136C shown in FIG. 5.

Referring to FIG. 5, the sixth pull-up output driver UPDRV5 may include the pull-up signal combination unit 136A, the sixth pull-up pre-driver 136B and the sixth pull-up main driver 136C.

The pull-up signal combination unit 136A generates a first pull-up selection control signal UPSEL'<5> and a plurality of second pull-up selection control signals UPCAL'<0:n> in response to the first and second pull-up pre-emphasis control signals PRE_EMP_UP and PRE_EMP_UP_MAX, the sixth pull-up selection code signal UPSEL<5> and the pull-up calibration code signals UPCAL<0:n>.

The sixth pull-up pre-driver 136B generates a plurality of sixth pull-up control code signals U5<0:m> in response to the pull-up signal UP_M, the first pull-up selection control signal UPSEL'<5> and the second pull-up selection control signals UPCAL'<0:n>.

The sixth pull-up main driver 136C drives the pad DQ with the high voltage in response to the sixth pull-up control code signals U5<0:m>. Herein, n may be equal to m or not.

For example, as illustrated in FIG. 6A, the pull-up signal combination unit 136A may include a first OR gate and a plurality of second OR gates. The first OR gate enables the first pull-up selection control signal UPSEL'<5> to a logic high level when the sixth pull-up selection code signal UPSEL<5> is enabled to a logic high level, or when the first pull-up pre-emphasis control signal PRE_EMP_UP is enabled to a logic high level. The second OR gates enable each of the second pull-up selection control signals UPCAL'<0:n> to a logic high level when each of the pull-up calibration code signals UPCAL<0:n> is enabled to a logic high level, or when the second pull-up pre-emphasis control signal PRE_EMP_UP_MAX is enabled to a logic high level.

As illustrated in FIG. 6B, the sixth pull-up pre-driver 136B may be the same as the first pull-up pre-driver 131A except that the first internal output signal DUP, the first pull-up selection code signal UPSEL<0> and the pull-up calibration code signals UPCAL<0:n> may be inputted to the first pull-up pre-driver 131A, whereas the pull-up signal UP_M, the first pull-up selection control signal UPSEL'<5> and the second pull-up selection control signals UPCAL'<0:n> may be inputted to the sixth pull-up pre-driver 136B.

As illustrated in FIG. 6C, the sixth pull-up main driver 136C may be the same as the first pull-up main driver 131B except that the first pull-up control code signals U0<0:m> may be inputted to the first pull-up main driver 131B, whereas the sixth pull-up control code signals U5<0:m> may be inputted to the sixth pull-up main driver 136C.

Referring back to FIG. 1, the pull-down circuits 140 to 160 may include a pull-down pre-emphasis enabling block 140, a pull-down selection block 150 and a pull-down output driving circuit block 160.

The pull-down pre-emphasis enabling block 140 detects an edge of the second internal signal DINB and generates a second pre-emphasis signal DN_EMP corresponding to the detection result.

The pull-down selection block 150 selects one signal as a pull-down signal DN_M among a second internal output signal DDN and the second pre-emphasis signal DN_EMP in response to the first pull-down pre-emphasis control signal PRE_EMP_DN.

The pull-down output driving circuit block 160 outputs a pull-down output signal DOUTDN corresponding to the second internal output signal DDN to the pad DQ in response to first to sixth pull-down selection code signals DNSEL<0:5> and a plurality of pull-down calibration code signals DNCAL<0:n>. The second internal output signal DDN may have the same phase as the second internal signal DINB.

The pull-down pre-emphasis enabling block 140 may enable the second pre-emphasis signal DN_EMP during a predetermined section corresponding to a rising edge of the second internal signal DINB. The predetermined section may be smaller than 1 UI of the second internal signal DINB. For example, the pull-down pre-emphasis enabling block 140 may include a pulse generator. Although not shown in the drawing, the pull-down pre-emphasis enabling block 140 may be enabled or disabled in response to the first pull-down pre-emphasis control signal PRE_EMP_DN.

The pull-down selection block 150 may output the second pre-emphasis signal DN_EMP as the pull-down signal DN_M when the first pull-down pre-emphasis control signal PRE_EMP_DN is enabled, and it may output the second internal output signal DDN as the pull-down signal DN_M when the first pull-down pre-emphasis control signal PRE_EMP_DN is disabled.

Figure 7:
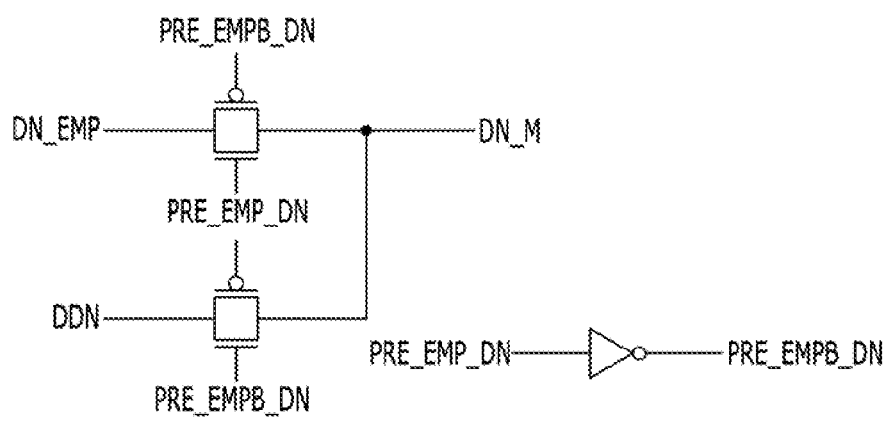
FIG. 7 a circuit diagram illustrating a pull-down selection block shown in FIG. 1.

FIG. 7 a circuit diagram illustrating the pull-down selection block 150 shown in FIG. 1.

Referring to FIG. 7, the pull-down selection block 150 may include first and second transmission gates. The first transmission gate selectively transfers the second pre-emphasis signal DN_EMP as the pull-down signal DN_M in response to the first pull-down pre-emphasis control signal PRE_EMP_DN and a second reverse control signal PRE_EMPB_DN. The second reverse control signal PRE_EMPB_DN is a reverse signal of the first pull-down pre-emphasis control signal PRE_EMP_DN. The second transmission gate selectively transfers the second internal output signal DDN as the pull-down signal DN_M in response to the first pull-down pre-emphasis control signal PRE_EMP_DN and the second reverse control signal PRE_EMPB_DN.

Referring back to FIG. 1, the pull-down output driving circuit block 160 may include first to sixth pull-down output drivers DNDRV0 to DNDRV5 connected in parallel to the pad DQ.

The first to sixth pull-down output drivers DNDRV0 to DNDRV5 may be determined to be enabled or disabled based on the first to sixth pull-down selection code signals DNSEL<0:5>, which is for controlling on-resistance Ron of the pull-down output driving circuit block 160 in order to secure signal integrity in diverse system conditions, e.g., a channel condition.

The first to fifth pull-down output drivers DNDRV0 to DNDRV4 may drive the pad DQ with the low voltage in response to the second internal output signal DDN, and the sixth pull-down output driver DNDRV5 may drive the pad DQ with the low voltage in response to the pull-down signal DN_M. In the embodiment of the present invention, it is described as an example that the sixth pull-down output driver DNDRV5 performs the pre-emphasis operation when the first to fifth pull-down output drivers DNDRV0 to DNDRV4 perform an output operation. A detailed description on the first to sixth pull-down output drivers DNDRV0 to DNDRV5 is provided hereafter.

Figure 8:
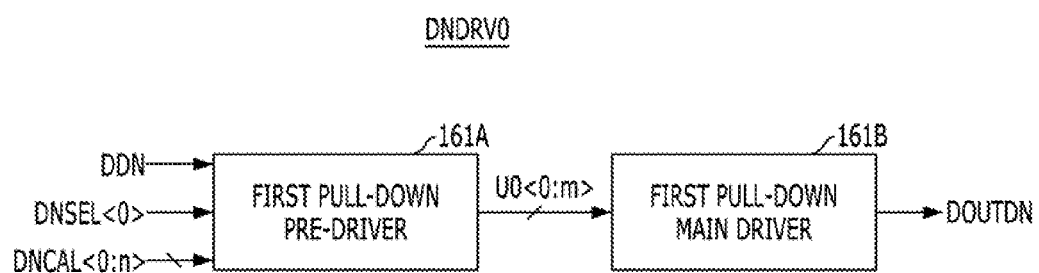
FIG. 8 is a block diagram illustrating a first pull-down output driver shown in FIG. 1.
Figure 9A:
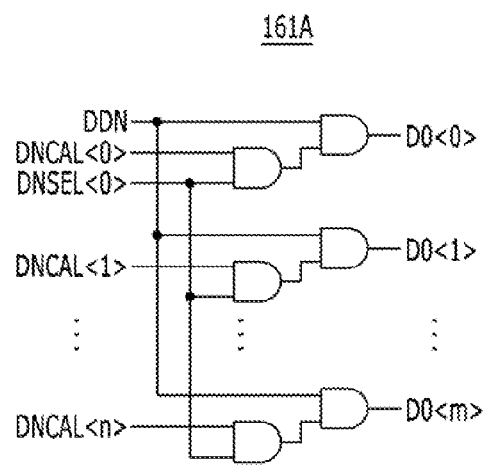
FIG. 9A is a circuit diagram illustrating a first pull-down pre-driver shown in FIG. 8.
Figure 9B:
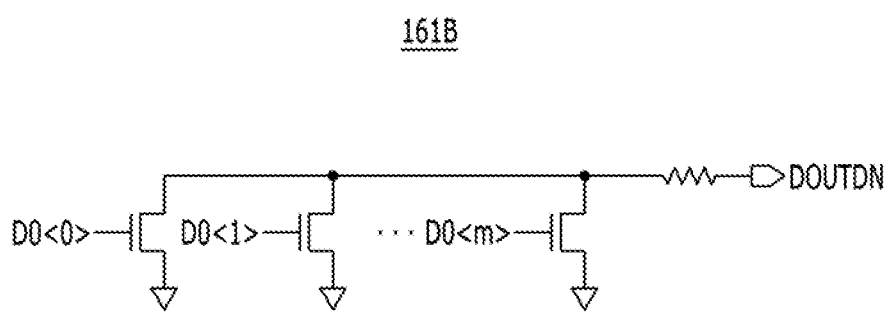
FIG. 9B is a circuit diagram illustrating a first pull-down main driver shown in FIG. 8.

FIG. 8 is a block diagram illustrating the first pull-down output driver DNDRV0 shown in FIG. 1. FIG. 9A is a circuit diagram illustrating a first pull-down pre-driver 161A shown in FIG. 8. FIG. 9B is a circuit diagram illustrating a first pull-down main driver 161B shown in FIG. 8.

Referring to FIG. 8, the first pull-down output driver DNDRV0 may include the first pull-down pre-driver 161A and the first pull-down main driver 161B. The first pull-down pre-driver 161A generates a plurality of first pull-down control code signals D0<0:m> in response to the second internal output signal DDN, the first pull-down selection code signal DNSEL<0> and the pull-down calibration code signals DNCAL<0:n>. The first pull-down main driver 161B drives the pad DQ with the low voltage in response to the first pull-down control code signals D0<0:m>. Herein, n may or may not be equal to m.

For example, as illustrated in FIG. 9A, the first pull-down pre-driver 161A may disable all the first pull-down control code signals D0<0:m> regardless of the pull-down calibration code signals DNCAL<0:n> when the second internal output signal DDN and the first pull-down selection code signal DNSEL<0> are disabled to a logic low level. The first pull-down pre-driver 161A may selectively enable the first pull-down control code signals D0<0:m> based on the pull-down calibration code signals DNCAL<0:n> when the second internal output signal DDN and the first pull-down selection code signal DNSEL<0> are enabled to a logic high level.

As illustrated in FIG. 9B, the first pull-down main driver 161B may include a plurality of NMOS transistors for driving the pad DQ with the low voltage in response to the first pull-down control code signals D0<0:m>. In other words, the NMOS transistors may be connected in parallel between a low voltage and the pad DQ, and the first pull-down control code signals D0<0:m> may be inputted to gates of the NMOS transistors, respectively.

Each of the second to fifth pull-down output drivers DNDRV1 to DNDRV4 are the same as the first pull-down output driver DNDRV0 except that the first pull-down selection code signal DNSEL<0> is inputted to the first pull-down output driver DNDRV0 whereas the second to fifth pull-down selection code signals DNSEL<1:4> are inputted to the second to fifth pull-down output drivers DNDRV1 to DNDRV4, respectively.

Figure 10:
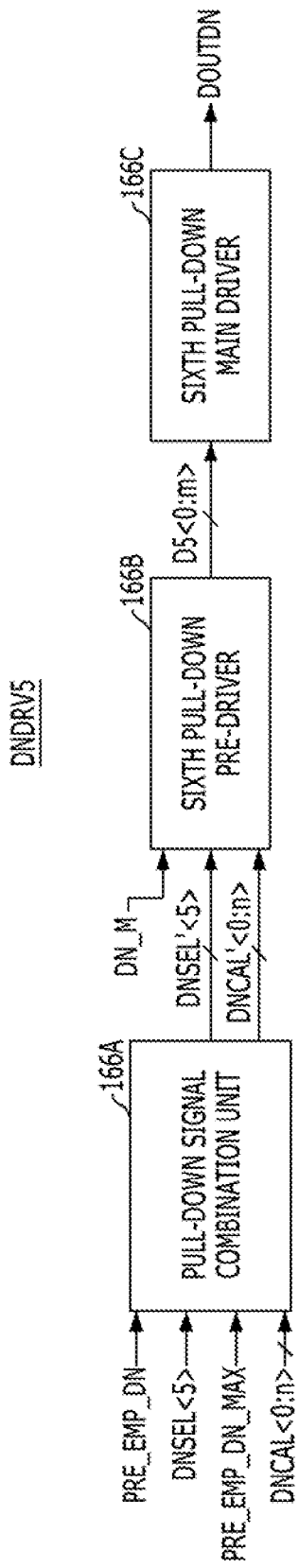
FIG. 10 is a block diagram illustrating a sixth pull-down output driver shown in FIG. 1.
Figure 11A:
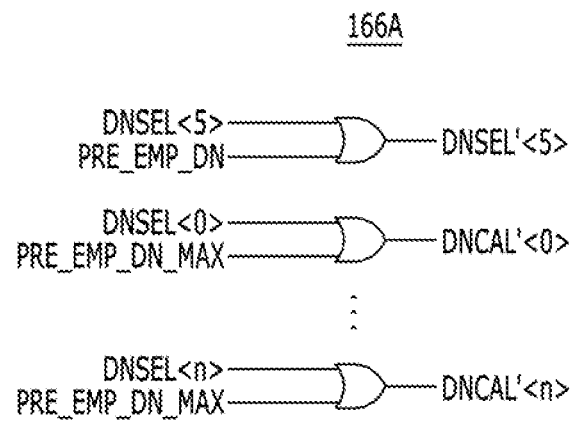
FIG. 11A is a circuit diagram illustrating a pull-down signal combination unit shown in FIG. 10.
Figure 11B:
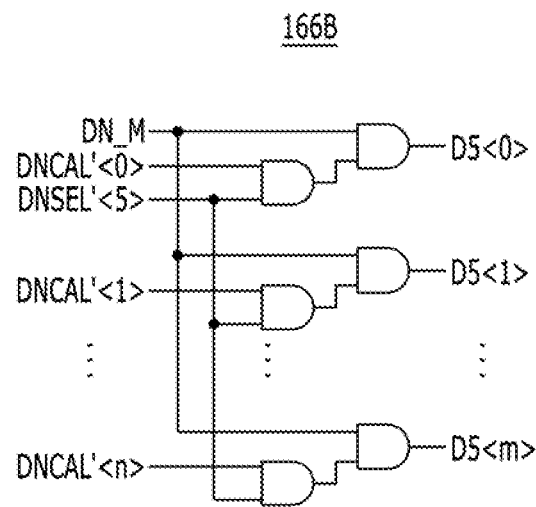
FIG. 11B is a circuit diagram illustrating a sixth pull-down pre-driver shown in FIG. 10.
Figure 11C:
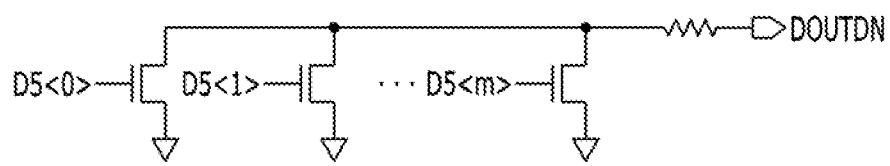
FIG. 11C is a circuit diagram illustrating a sixth pull-down main driver shown in FIG. 10.

FIG. 10 is a block diagram illustrating the sixth pull-down output driver DNDRV5. FIG. 11A is a circuit diagram illustrating a pull-down signal combination unit 166A shown in FIG. 10. FIG. 11B is a circuit diagram illustrating a sixth pull-down pre-driver 166B shown in FIG. 10. FIG. 11C is a circuit diagram illustrating a sixth pull-down main driver 166C shown in FIG. 10.

Referring to FIG. 10, the sixth pull-down output driver DNDRV5 may include the pull-down signal combination unit 166A, the sixth pull-down pre-driver 166B and the sixth pull-down main driver 166C.

The pull-down signal combination unit 166A generates a first pull-down selection control signal DNSEL'<5> and a plurality of second pull-down selection control signals DNCAL'<0:n> in response to the first and second pull-down pre-emphasis control signals PRE_EMP_DN and PRE_EMP_DN_MAX, the sixth pull-down selection code signal DNSEL<5> and the pull-down calibration code signals DNCAL<0:n>.

The sixth pull-down pre-driver 166B generates a plurality of sixth pull-down control code signals D5<0:m> in response to the pull-down signal DN_M, the first pull-down selection control signal DNSEL'<5> and the second pull-down selection control signals DNCAL'<0:n>.

The sixth pull-down main driver 166C drives the pad DQ with the low voltage in response to the sixth pull-down control code signals D5<0:m>. Herein, n may or may not be equal to m.

For example, as illustrated in FIG. 11A, the pull-down signal combination unit 166A may include a first OR gate and a plurality of second OR gates. The first OR gate enables the first pull-down selection control signal DNSEL'<5> to a logic high level when the sixth pull-down selection code signal DNSEL<5> is enabled to a logic high level, or when the first pull-down pre-emphasis control signal PRE_EMP_DN is enabled to a logic high level. The second OR gates enable each of the second pull-down selection control signals DNCAL'<0:n> to a logic high level when each of the pull-down calibration code signals DNCAL<0:n> is enabled to a logic high level, or when the second pull-down pre-emphasis control signal PRE_EMP_DN_MAX is enabled to a logic high level.

As illustrated in FIG. 11B, the sixth pull-down pre-driver 166B may be the same as the first pull-down pre-driver 161A except that the second internal output signal DDN, the first pull-down selection code signal DNSEL<0> and the pull-down calibration code signals DNCAL<0:n> may be inputted to the first pull-down pre-driver 161A, whereas the pull-down signal DN_M, the first pull-down selection control signal DNSEL'<5> and the second pull-down selection control signals DNCAL'<0:n> may be inputted to the sixth pull-down pre-driver 166B.

As illustrated in FIG. 11C, the sixth pull-down main driver 166C may be the same as the first pull-down main driver 161B except that the first pull-down control code signals D0<0:m> may be inputted to the first pull-down main driver 161B, whereas the sixth pull-down control code signals D5<0:m> may be inputted to the sixth pull-down main driver 166C.

Figure 12:
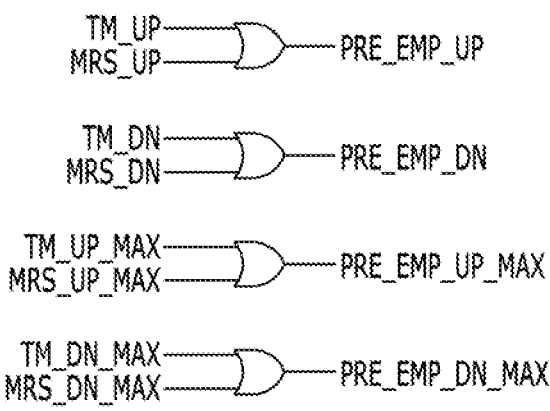
FIG. 12 is a circuit diagram illustrating a control signal generation portion shown in FIG. 1.

FIG. 12 is a circuit diagram illustrating the control signal generation portion 170 shown in FIG. 1.

Referring to FIG. 12, the control signal generation portion 170 may include a first OR gate, a second OR gate, a third OR gate and a fourth OR gate. The first OR gate enables the first pull-up pre-emphasis control signal PRE_EMP_UP to a logic high level when a first test mode TM_UP is enabled to a logic high level during a test mode, or when a predetermined first MRS code signal MRS_UP is enabled to a logic high level during a normal mode. The second OR gate enables the first pull-down pre-emphasis control signal PRE_EMP_DN to a logic high level when a second test mode signal TM_DN is enabled to a logic high level during the test mode, or when a predetermined second MRS code signal MRS_DN is enabled to a logic high level during the normal mode. The third OR gate enables the second pull-up pre-emphasis control signal PRE_EMP_UP_MAX to a logic high level when a third test mode signal TM_UP_MAX is enabled to a logic high level during the test mode, or when a predetermined third MRS code signal MRS_UP_MAX is enabled to a logic high level during the normal mode. The fourth OR gate enables the second pull-down pre-emphasis control signal PRE_EMP_DN_MAX to a logic high level when a fourth test mode signal TM_DN_MAX is enabled to a logic high level during the test mode, or when a predetermined fourth MRS code signal MRS_DN_MAX is enabled to a logic high level during the normal mode.

The control signal generation portion 170 may enable the first and second pull-up pre-emphasis control signals PRE_EMP_UP and PRE_EMP_UP_MAX and the first and second pull-down pre-emphasis control signals PRE_EMP_DN and PRE_EMP_DN_MAX based on whether the pre-emphasis operation is performed during the test mode or the normal mode. Particularly, the control signal generation portion 170 may selectively enable the first and second pull-up pre-emphasis control signals PRE_EMP_UP and PRE_EMP_UP_MAX and the first and second pull-down pre-emphasis control signals PRE_EMP_DN and PRE_EMP_DN_MAX.

The test mode signal TM_UP, the second test mode signal TM_DN, the third test mode signal TM_UP_MAX, the fourth test mode signal TM_DN_MAX, the first MRS code signal MRS_UP, the second MRS code signal MRS_DN, the third MRS code signal MRS_UP_MAX and the fourth MRS code signal MRS_DN_MAX may be external signals inputted from an exterior or internal signals generated inside. Particularly, the first MRS code signal MRS_UP, the second MRS code signal MRS_DN, the third MRS code signal MRS_UP_MAX and the fourth MRS code signal MRS_DN_MAX may be fuse signals provided from a fuse circuit (not shown).

Hereafter, an operation of the semiconductor device 100 having the aforementioned structure in accordance with the embodiment of the present invention is described.

It will be described as an example that the pull-up output driving circuit block 130 and the pull-down output driving circuit block 160 operate with a driving power under full strength. In other words, an example will be described in which some of the first to fifth pull-up output drivers UPDRV0 to UPDRV4 are enabled, and some of the first to fifth pull-down output drivers DNDRV0 to DNDRV4 are enabled.

Figure 13:
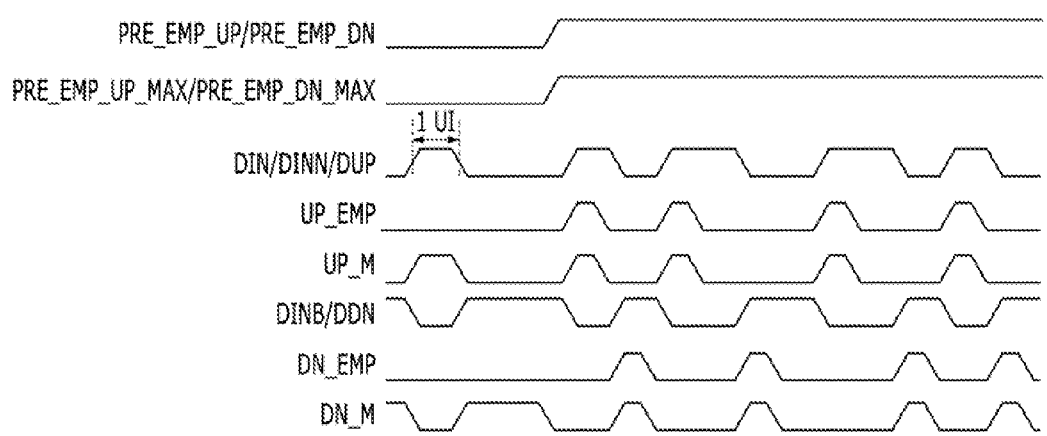
FIG. 13 is a timing diagram illustrating an operation of a semiconductor device in accordance with the embodiment of the present invention.

FIG. 13 is a timing diagram illustrating an operation of the semiconductor device 100 in accordance with an embodiment of the present invention.

Referring to FIG. 13, the pull-up selection block 120 may output the first pre-emphasis signal UP_EMP, which is outputted from the pull-up pre-emphasis enabling block 110, as the pull-up signal UP_M when the first pull-up pre-emphasis control signal PRE_EMP_UP is enabled to a logic high level. The first pre-emphasis signal UP_EMP may be a signal which is enabled to a logic high level during a smaller section than 1 UI of the first internal signal DINN.

The sixth pull-up output driver UPDRV5 may be enabled as the first pull-up pre-emphasis control signal PRE_EMP_UP is enabled to a logic high level, and may drive the pad DQ with a high voltage based on the pull-up signal UP_M.

To be specific, the pull-up signal combination unit 136A may enable the first pull-up selection control signal UPSEL'<5> as the first pull-up pre-emphasis control signal PRE_EMP_UP is enabled although the sixth pull-up selection code signal UPSEL<5> is disabled. When the second pull-up pre-emphasis control signal PRE_EMP_UP_MAX is disabled to a logic low level, and a portion of the pull-up calibration code signals UPCAL<0:n> is enabled, the pull-up signal combination unit 136A may enable a portion of the second pull-up selection control signals UPCAL'<0:n> based on the pull-up calibration code signals UPCAL<0:n>. Then, the sixth pull-up pre-driver 136B may enable a portion of the sixth pull-up control code signals U5<0:m>.

Accordingly, a portion of the NMOS transistors included in the sixth pull-up main driver 136C may be turned on, and the turned-on NMOS transistors may drive the pad DQ with a high voltage.

When the second pull-up pre-emphasis control signal PRE_EMP_UP_MAX together with the first pull-up pre-emphasis control signal PRE_EMP_UP is enabled to a logic high level, the sixth pull-up output driver UPDRV5 may drive the pad DQ with a large amount of driving power.

To be specific, the pull-up signal combination unit 136A may enable the first pull-up selection control signal UPSEL'<5> as the first pull-up pre-emphasis control signal PRE_EMP_UP is enabled although the sixth pull-up selection code signal UPSEL<5> is disabled, and may enable all the second pull-up selection control signals UPCAL'<0:n> regardless of the pull-up calibration code signals UPCAL<0:n> as the second pull-up pre-emphasis control signal PRE_EMP_UP_MAX is enabled. Then, the sixth pull-up pre-driver 136B may enable all the sixth pull-up control code signals U5<0:m>.

Accordingly, the NMOS transistors included in the sixth pull-up main driver 136C may be turned on in response to the sixth pull-up control code signals U5<0:m>, and the turned-on NMOS transistors may drive the pad DQ with a high voltage.

As a result, the driving power of the sixth pull-up output driver UPDRV5 may vary according to the enablement of the second pull-up pre-emphasis control signal PRE_EMP_UP_MAX while the first pull-up pre-emphasis control signal PRE_EMP_UP is enabled.

Simultaneously, the first to fifth pull-up output drivers UPDRV0 to UPDRV4 may drive the pad DQ with a high voltage in response to the first internal output signal DUP. The first to fifth pull-up output drivers UPDRV0 to UPDRV4 may be enabled based on the first to fifth pull-up selection code signals UPSEL<0:4> and drive the pad DQ with a fixed driving power corresponding to the pull-up calibration code signals UPCAL<0:n>.

The pull-down selection block 150 may output the second pre-emphasis signal DN_EMP, which is outputted from the pull-down pre-emphasis enabling block 140, as the pull-down signal DN_M when the first pull-down pre-emphasis control signal PRE_EMP_DN is enabled to a logic high level. The second pre-emphasis signal DN_EMP may be a signal which is enabled to a logic high level during a smaller section than 1 UI of the second internal signal DINB.

The sixth pull-down output driver DNDRV5 may be enabled as the first pull-down pre-emphasis control signal PRE_EMP_DN is enabled to a logic high level, and may drive the pad DQ with a low voltage based on the pull-down signal DN_M.

To be specific, the pull-down signal combination unit 166A may enable the first pull-down selection control signal DNSEL'<5> as the first pull-down pre-emphasis control signal PRE_EMP_DN is enabled although the sixth pull-down selection code signal DNSEL<5> is disabled. When the second pull-down pre-emphasis control signal PRE_EMP_DN_MAX is disabled to a logic low level, and a portion of the pull-down calibration code signals DNCAL<0:n> is enabled, the pull-down signal combination unit 166A may enable a portion of the second pull-down selection control signals DNCAL'<0:n> based on the pull-down calibration code signals DNCAL<0:n>. Then, the sixth pull-down pre-driver 166B may enable a portion of the sixth pull-down control code signals D5<0:m>.

Accordingly, a portion of the NMOS transistors included in the sixth pull-down main driver 166C may be turned on, and the turned-on NMOS transistors may drive the pad DQ with a low voltage.

When the second pull-down pre-emphasis control signal PRE_EMP_DN_MAX together with the first pull-down pre-emphasis control signal PRE_EMP_DN is enabled to a logic high level, the sixth pull-down output driver DNDRV5 may drive the pad DQ with a large amount of driving power.

To be specific, the pull-down signal combination unit 166A may enable the first pull-down selection control signal DNSEL'<5> as the first pull-down pre-emphasis control signal PRE_EMP_DN is enabled although the sixth pull-down selection code signal DNSEL<5> is disabled, and may enable all the second pull-down selection control signals DNCAL'<0:n> regardless of the pull-down calibration code signals DNCAL<0:n> as the second pull-down pre-emphasis control signal PRE_EMP_DN_MAX is enabled. Then, the sixth pull-down pre-driver 166B may enable all the sixth pull-down control code signals D5<0:m>.

Accordingly, the NMOS transistors included in the sixth pull-down main driver 166C may be turned on in response to the sixth pull-down control code signals D5<0:m>, and the turned-on NMOS transistors may drive the pad DQ with a low voltage.

As a result, the driving power of the sixth pull-down output driver DNDRV5 may vary according to the enablement of the second pull-down pre-emphasis control signal PRE_EMP_DN_MAX while the first pull-down pre-emphasis control signal PRE_EMP_DN is enabled.

Simultaneously, the first to fifth pull-down output drivers DNDRV0 to DNDRV4 may drive the pad DQ with a low voltage in response to the second internal output signal DDN. The first to fifth pull-down output drivers DNDRV0 to DNDRV4 may be enabled based on the first to fifth pull-down selection code signals DNSEL<0:4> and drive the pad DQ with a fixed driving power corresponding to the pull-down calibration code signals DNCAL<0:n>.

In accordance with the embodiments of the present invention, when a plurality of output drivers connected in parallel to a pad is partially used, in other words, when the maximum driving power of a plurality of output drivers is being used at less than full strength, it is advantageous that part of the plurality of output drivers, which does not contribute to the maximum driving power, be used as a pre-emphasis circuit. Also, when the output driver is used as the pre-emphasis circuit, it is advantageous that the driving power may be greatly improved as a plurality of NMOS transistors included in the output driver are all turned on regardless of a predetermined value.

In accordance with the embodiments of the present invention, the additional area for a pre-emphasis circuit may be minimized since the output driver may replace the pre-emphasis circuit. Also, a high-speed operation may be performed during a data output since such parasitic component caused by the pre-emphasis circuit may be reduced.

While the present invention has been described with respect to the specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

For example, although a case where just one among a plurality of output drivers connected in parallel to a pad is used as a pre-emphasis circuit is described as an example in the embodiment, the embodiment does not limit the spirit or concept of the present invention. Two or more output drivers among the output drivers connected in parallel to the pad may be used as the pre-emphasis circuit.

Figure 14:
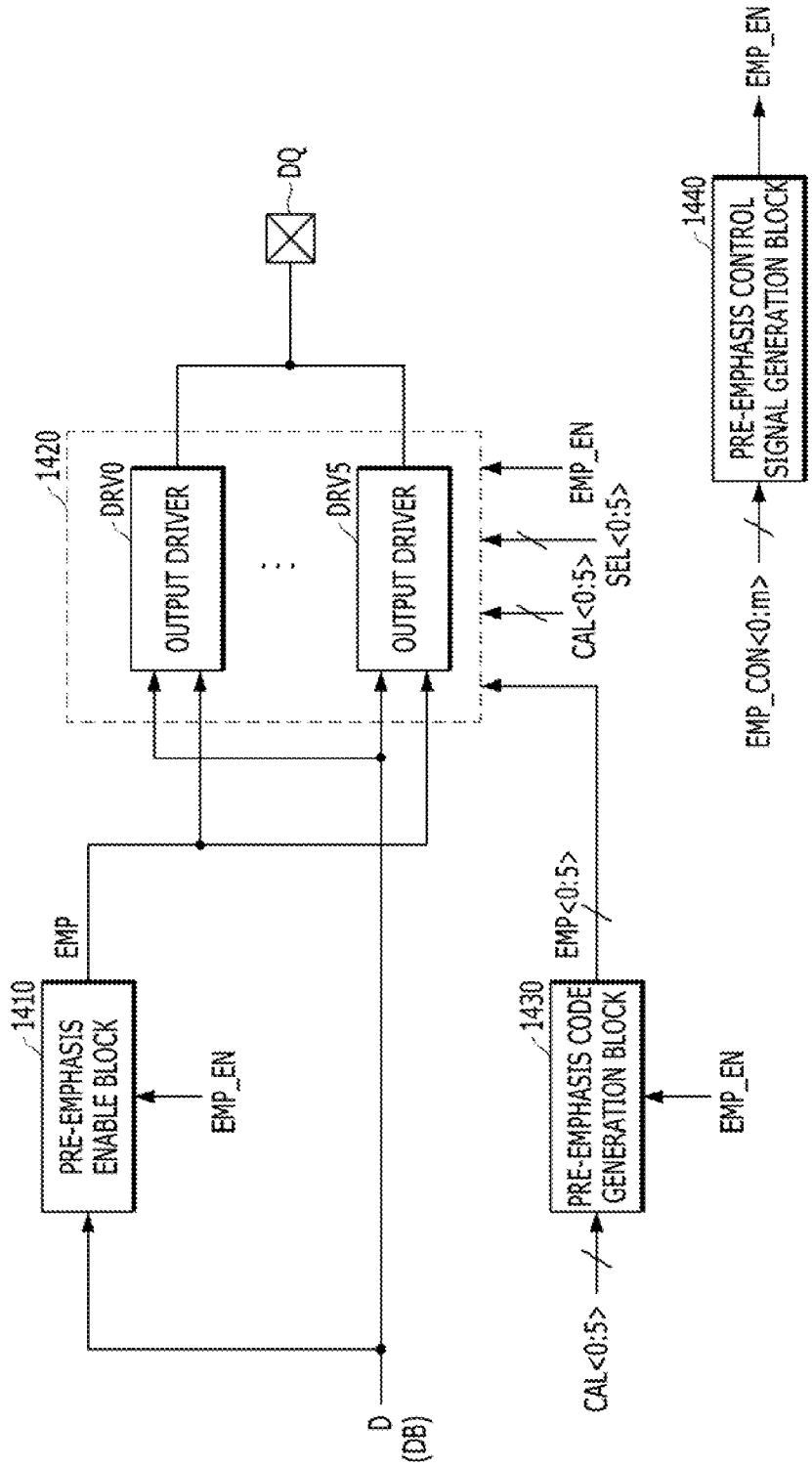
FIG. 14 is a configuration diagram illustrating a representation of an example of a semiconductor device in accordance with an embodiment.

FIG. 14 is a configuration diagram illustrating a representation of an example of a semiconductor device in accordance with an embodiment.

Referring to FIG. 14, the semiconductor device may include a pre-emphasis enable block 1410, an output driving circuit block 1420, a pre-emphasis code generation block 1430, and a pre-emphasis control signal generation block 1440.

The pre-emphasis enable block 1410 may detect the edge of output data D, and generate a pre-emphasis signal EMP corresponding to a detection result.

The pre-emphasis enable block 1410 may enable the pre-emphasis signal EMP for a predetermined period corresponding to the rising edge of the output data D. The predetermined period may be shorter than 1 UI (unit interval) of the output data D. The pre-emphasis enable block 1410 may include a pulse generator. The pre-emphasis enable block 1410 may be enabled in the case where the semiconductor device is set to perform a pre-emphasis operation (a pre-emphasis control signal EMP_EN is enabled), and may be disabled in the case where the semiconductor device is set to not perform the pre-emphasis operation (the pre-emphasis control signal EMP_EN is disabled).

The output driving circuit block 1420 may include first to sixth output drivers DRV0 to DRV5 which are coupled in parallel to a pad DQ. The first to sixth output drivers DRV0 to DRV5 may be determined in terms of whether to be enabled or disabled, in response to selection code signals corresponding thereto among a plurality of selection code signals SEL<0:5>.

An output driver which is enabled among the output drivers DRV0 to DRV5 may drive the pad DQ in response to the output data D, and may drive the pad DQ in response to the pre-emphasis signal EMP in the case where the pre-emphasis control signal EMP_EN is enabled. That is to say, an output driver which is enabled may perform a data output operation, and may perform both the data output operation and the pre-emphasis operation in the case where it is set to perform the pre-emphasis operation.

An output driver which is enabled may drive the pad DQ with a first driving force corresponding to a plurality of calibration code signals CAL<0:5> in response to the output data D. Also, an output driver which is enabled may drive the pad DQ with a second driving force corresponding to a plurality of pre-emphasis code signals EMP<0:5> in response to the pre-emphasis signal EMP in the case where the pre-emphasis control signal EMP_EN is enabled. In the case where the value of the maximum driving force of the output drivers DRV0 to DRV5 is represented by DF_MAX, the first driving force is represented by DF1 and the second driving force is represented by DF2, a relationship DF_MAX=DF1+DF2 may be established among the maximum driving force, the first driving force and the second driving force. In other words, the second driving force may be a driving force that is acquired by subtracting the first driving force from the maximum driving force (DF2=DF_MAX−DF1).

The pre-emphasis code generation block 1430 may generate the plurality of pre-emphasis code signals EMP<0:5> which have values complementary to the plurality of calibration code signals CAL<0:5>, in the case where the pre-emphasis control signal EMP_EN is enabled. The pre-emphasis code generation block 1430 may generate the plurality of pre-emphasis code signals EMP<0:5> to a predetermined value in the case where the pre-emphasis control signal EMP_EN is disabled. For reference, when the values of two codes are complementary to each other, it may be meant that the values of the two codes are maximum values that the corresponding codes may have.

For example, since the maximum value that the plurality of calibration code signals CAL<0:5> and the plurality of pre-emphasis code signals EMP<0:5> may have is '111111,' when the value of the plurality of calibration code signals CAL<0:5> is '010101,' the plurality of pre-emphasis code signals EMP<0:5> may have the value of '101010' such that the sum of the two values becomes '111111.'

The pre-emphasis code generation block 1430 may generate the plurality of pre-emphasis code signals EMP<0:5> which have the value of '000000' or '111111' in the case where the pre-emphasis control signal EMP_EN is disabled.

In order for the above-described operation, the pre-emphasis code generation block 1430 may invert all the plurality of calibration code signals CAL<0> to CAL<5> and transfer the inverted calibration code signals CAL<0> to CAL<5> as the plurality of pre-emphasis code signals EMP<0> to EMP<5>, in the case where the pre-emphasis control signal EMP_EN is enabled. In the above-described example, since the values of the calibration code signals CAL<0> to CAL<5> are 1, 0, 1, 0, 1 and 0, respectively, the pre-emphasis code generation block 1430 may transfer the values 0, 1, 0, 1, 0 and 1 acquired by inverting the values 1, 0, 1, 0, 1 and 0, as the pre-emphasis code signals EMP<0> to EMP<5>, respectively.

The output drivers DRV0 to DRV5 may be pull-up output drivers which pull-up drive the pad DQ to a high voltage in response to the output data D. Alternatively, the output drivers DRV0 to DRV5 may be pull-down output drivers which pull-down drive the pad DQ to a low voltage in response to inverted data DB which is opposite in phase to the output data D.

The pre-emphasis control signal generation block 1440 may generate the pre-emphasis control signal EMP_EN in response to pre-emphasis control informations EMP_CON<0:m>. The pre-emphasis control signal generation block 1440 may enable the pre-emphasis control signal EMP_EN in the case where the semiconductor device is set to perform the pre-emphasis operation, according to the pre-emphasis control informations EMP_CON<0:m>, and disable the pre-emphasis control signal EMP_EN in the case where the semiconductor device is set to not perform the pre-emphasis operation, according to the pre-emphasis control informations EMP_CON<0:m>.

The pre-emphasis control informations EMP_CON<0:m> may be signals which are inputted from outside the semiconductor device or signals which are generated inside the semiconductor device. In particular, the pre-emphasis control informations EMP_CON<0:m> may be informations which are stored in a fuse circuit (not shown) included in the semiconductor device, through fuse cutting, and are provided from the fuse circuit in the operation of the semiconductor device.

In the semiconductor device of FIG. 14, each output driver may perform driving for the data output operation (hereinafter, referred to as output driving) and driving for the pre-emphasis operation (hereinafter, referred to as pre-emphasis driving). In the case of the semiconductor device of FIG. 1, an output driver which is not used in output driving may be used in the pre-emphasis operation. Conversely, in the case of the semiconductor device of FIG. 14, even an output driver which is used in the data output operation may be used in the pre-emphasis operation when the first driving force is smaller than the maximum driving force. Namely, in the case where the first driving force is not the maximum driving force, one output driver may be used in the data output operation and the pre-emphasis operation together.

For reference, the output drivers DRV0 to DRV5 of the semiconductor device of FIG. 14 may be pull-up output drivers which pull-up drive the pad DQ or pull-down output drivers which pull-down drive the pad DQ. In the case where the output drivers DRV0 to DRV5 are pull-up output drivers, they may pull-up drive the pad DQ in response to the output data D. In the case where the output drivers DRV0 to DRV5 are pull-down output drivers, they may pull-down drive the pad DQ in response to the inverted data DB. Hereinbelow, descriptions will be made on the assumption that the output drivers DRV0 to DRV5 of the semiconductor device are pull-up output drivers.

Figure 15:
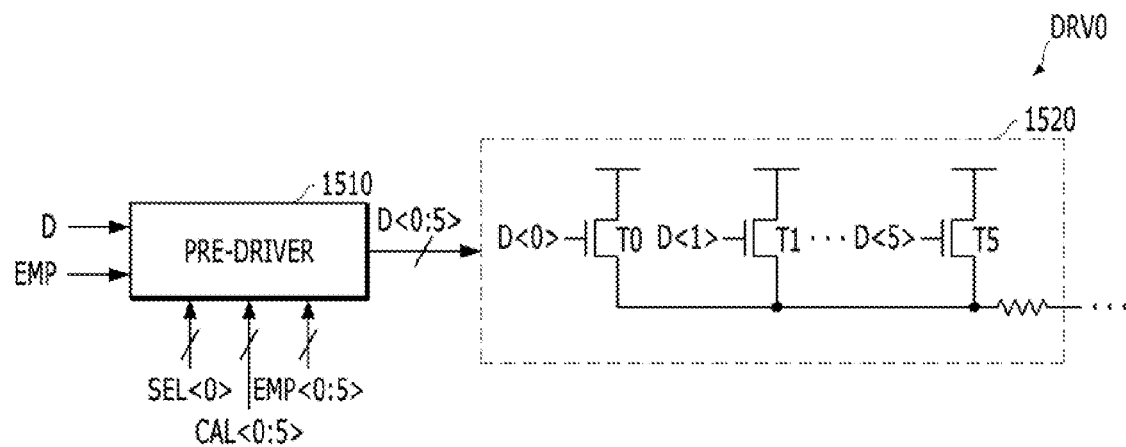
FIG. 15 is a configuration diagram illustrating a representation of an example of the output driver DRV0 in accordance with the embodiment.

FIG. 15 is a configuration diagram illustrating a representation of an example of the output driver DRV0 in accordance with the embodiment.

Referring to FIG. 15, the output driver DRV0 may include a pre-driver 1510 and a main driver 1520.

The pre-driver 1510 may transfer the output data D and the pre-emphasis signal EMP, as a plurality of control code signals D<0:5>, in response to the plurality of calibration code signals CAL<0:5> and the plurality of pre-emphasis code signals EMP<0:5> in the case where the output driver DRV0 is enabled (in the case where the selection code signal SEL<0> is enabled).

In the case where the selection code signal SEL<0> is enabled, the pre-driver 1510 may transfer the output data D as control code signals corresponding to enabled calibration code signals CAL<0:5> among the plurality of control code signals D<0:5>, and transfer the pre-emphasis signal EMP as control code signals corresponding to enabled pre-emphasis code signals EMP<0:5> among the plurality of control code signals D<0:5>.

For example, in the case where the respective control code signals D<0> to D<5> correspond to the calibration code signals CAL<0> to CAL<5> and the pre-emphasis code signals EMP<0> to EMP<5>, if the calibration code signals CAL<0> to CAL<5> are respectively 1, 0, 1, 0, 1 and 0 and the pre-emphasis code signals EMP<0> to EMP<5> are respectively 0, 1, 0, 1, 0 and 1, the pre-driver 1510 may transfer the output data D as the control code signals D<0>, D<2> and D<4> corresponding to the calibration code signals CAL<0>, CAL<2> and CAL<4> of which values are 1, and transfer the pre-emphasis signal EMP as the control code signals D<1>, D<3> and D<5> corresponding to the pre-emphasis code signals EMP<1>, EMP<3> and EMP<5> of which values are 1 as well.

The main driver 1520 may include a plurality of driving transistors T0 to T5 each corresponding to one control code signal among the plurality of control code signals D<0:5>, and drive the pad DQ in response to the plurality of control code signals D<0:5>.

Each of the plurality of driving transistors T0 to T5 may be turned on/off in response to a control code signal corresponding thereto among the plurality of control code signals D<0:5>. In the case where the driving transistors T0 to T5 are NMOS transistors, each driving transistor may be turned on when a control code signal is '1' and be turned off when a control code signal is '0.' The driving force of the output driver DRV0 may be changed depending upon the number of driving transistors which are turned on simultaneously and the driving force of each driving transistor which is turned on.

In the case where the semiconductor device is set to perform the pre-emphasis operation, driving transistors except driving transistors to be used in the data output operation, among the pluralities of driving transistors T0 to T5 of enabled output drivers, may be used in the pre-emphasis operation.

For example, in the case where the driving transistors T0, T2 and T4 perform output driving in the data output operation, the driving transistors T1, T3 and T5 may perform pre-emphasis driving in the pre-emphasis operation.

The output drivers DRV1 to DRV5 which are not illustrated may have the same configuration as the output driver DRV0, and may operate in the same manner as the output driver DRV0. Only selection code signals corresponding thereto may differ.

Figure 16:
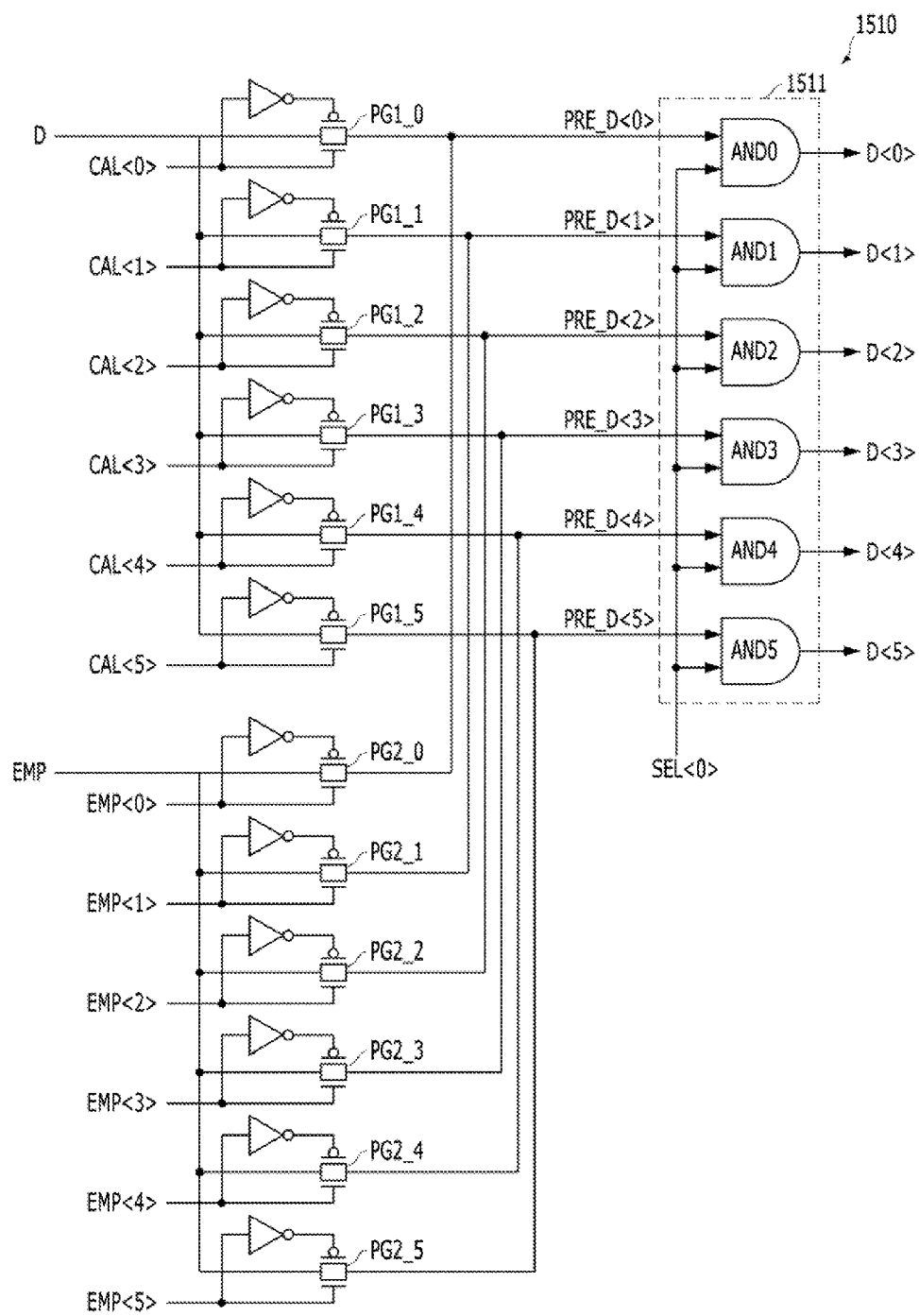
FIG. 16 is a configuration diagram illustrating a representation of an example of the pre-driver 1510.

FIG. 16 is a configuration diagram illustrating a representation of an example of the pre-driver 1510.

Referring to FIG. 16, the pre-driver 1510 may include a plurality of first transfer parts PG1_0 to PG1_5, a plurality of second transfer parts PG2_0 to PG2_5, and a third transfer part 1511.

The plurality of first transfer parts PG1_0 to PG1_5 may transfer the output data D as pre-control code signals corresponding thereto among a plurality of pre-control code signals PRE_D<0:5>, in the case where calibration code signals corresponding thereto among the plurality of calibration code signals CAL<0:5> are enabled.

The plurality of second transfer parts PG2_0 to PG2_5 may transfer the pre-emphasis signal EMP as pre-control code signals corresponding thereto among the plurality of pre-control code signals PRE_D<0:5>, in the case where pre-emphasis code signals corresponding thereto among the plurality of pre-emphasis code signals EMP<0:5> are enabled.

The third transfer part 1511 may transfer the plurality of pre-control code signals PRE_D<0:5> as the plurality of control code signals D<0:5>, in the case where the corresponding selection code signal SEL<0> among the plurality of selection code signals SEL<0:5> is enabled. To this end, the third transfer part 1511 may include a plurality of AND gates AND0 to AND5. The plurality of pre-control code signals PRE_D<0:5> may correspond to the plurality of control code signals D<0:5>, respectively.

Figure 17:
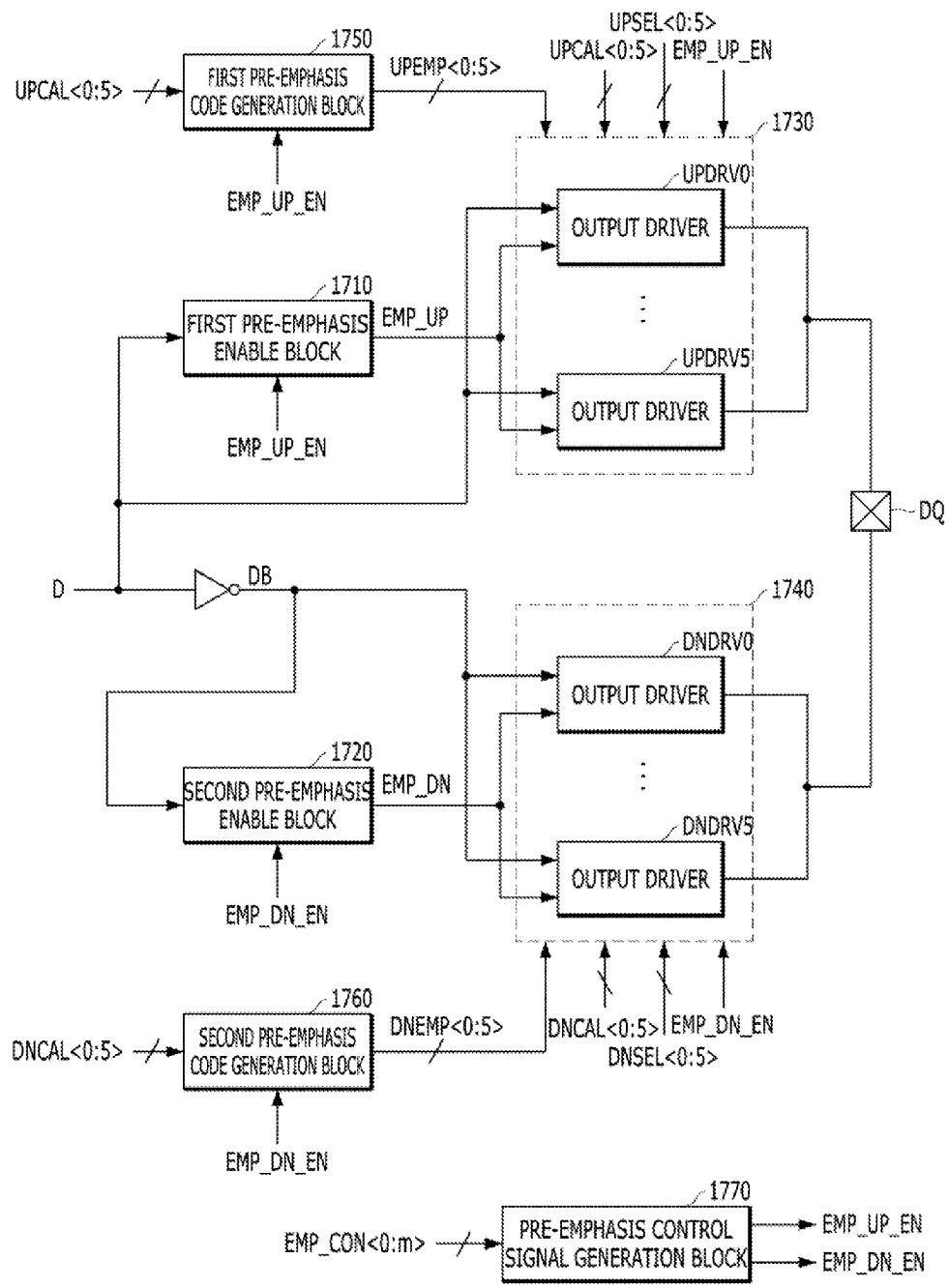
FIG. 17 is a configuration diagram illustrating a representation of an example of a semiconductor device in accordance with an embodiment.

FIG. 17 is a configuration diagram illustrating a representation of an example of a semiconductor device in accordance with an embodiment.

Referring to FIG. 17, the semiconductor device may include first and second pre-emphasis enable blocks 1710 and 1720, pull-up and pull-down output driving circuit blocks 1730 and 1740, first and second pre-emphasis code generation blocks 1750 and 1760, and a pre-emphasis control signal generation block 1770.

The first pre-emphasis enable block 1710 may detect the edge of output data D, and generate a pull-up pre-emphasis signal EMP_UP corresponding to a detection result.

The first pre-emphasis enable block 1710 may enable the pull-up pre-emphasis signal EMP_UP for a predetermined period corresponding to the rising edge of the output data D. The predetermined period may be shorter than 1 UI (unit interval) of the output data D. The first pre-emphasis enable block 1710 may include a pulse generator. The first pre-emphasis enable block 1710 may be enabled in the case where the semiconductor device is set to perform a pull-up pre-emphasis operation (a first pre-emphasis control signal EMP_UP_EN is enabled), and may be disabled in the case where the semiconductor device is set to not perform the pull-up pre-emphasis operation (the first pre-emphasis control signal EMP_UP_EN is disabled).

The second pre-emphasis enable block 1720 may detect the edge of inverted data DB, and generate a pull-down pre-emphasis signal EMP_DN corresponding to a detection result.

The second pre-emphasis enable block 1720 may enable the pull-down pre-emphasis signal EMP_DN for a predetermined period corresponding to the rising edge of the inverted data DB. The predetermined period may be shorter than 1 UI (unit interval) of the inverted data DB. The second pre-emphasis enable block 1720 may include a pulse generator. The second pre-emphasis enable block 1720 may be enabled in the case where the semiconductor device is set to perform a pull-down pre-emphasis operation (a second pre-emphasis control signal EMP_DN_EN is enabled), and may be disabled in the case where the semiconductor device is set to not perform the pull-down pre-emphasis operation (the second pre-emphasis control signal EMP_DN_EN is disabled).

The pull-up output driving circuit block 1730 may include first to sixth pull-up output drivers UPDRV0 to UPDRV5 which are coupled in parallel to a pad DQ. The first to sixth pull-up output drivers UPDRV0 to UPDRV5 may be determined in terms of whether to be enabled or disabled, in response to pull-up selection code signals corresponding thereto among a plurality of pull-up selection code signals UPSEL<0:5>.

A pull-up output driver which is enabled among the pull-up output drivers UPDRV0 to UPDRV5 may pull-up drive the pad DQ in response to the output data D, and may pull-up drive the pad DQ in response to the pull-up pre-emphasis signal EMP_UP in the case where the first pre-emphasis control signal EMP_UP_EN is enabled. That is to say, a pull-up output driver which is enabled may perform a data output operation, and may perform both the data output operation and the pull-up pre-emphasis operation in the case where it is set to perform the pull-up pre-emphasis operation.

A pull-up output driver which is enabled may pull-up drive the pad DQ with a first driving force corresponding to a plurality of pull-up calibration code signals UPCAL<0:5> in response to the output data D. Also, a pull-up output driver which is enabled may pull-up drive the pad DQ with a second driving force corresponding to a plurality of pull-up pre-emphasis code signals UPEMP<0:5> in response to the pull-up pre-emphasis signal EMP_UP in the case where the first pre-emphasis control signal EMP_UP_EN is enabled. In the case where the value of the maximum driving force of the pull-up output drivers UPDRV0 to UPDRV5 is represented by DF_UP_MAX, the first driving force is represented by DF1 and the second driving force is represented by DF2, a relationship DF_UP_MAX=DF1+DF2 may be established among the maximum driving force, the first driving force and the second driving force. In other words, the second driving force may be a driving force that is acquired by subtracting the first driving force from the maximum driving force (DF2=DF_UP_MAX−DF1).

The pull-down output driving circuit block 1740 may include first to sixth pull-down output drivers DNDRV0 to DNDRV5 which are coupled in parallel to the pad DQ. The first to sixth pull-down output drivers DNDRV0 to DNDRV5 may be determined in terms of whether to be enabled or disabled, in response to pull-down selection code signals corresponding thereto among a plurality of pull-down selection code signals DNSEL<0:5>.

A pull-down output driver which is enabled among the pull-down output drivers DNDRV0 to DNDRV5 may pull-down drive the pad DQ in response to the inverted data DB, and may pull-down drive the pad DQ in response to the pull-down pre-emphasis signal EMP_DN in the case where the second pre-emphasis control signal EMP_DN_EN is enabled. That is to say, a pull-down output driver which is enabled may perform a data output operation, and may perform both the data output operation and the pull-down pre-emphasis operation in the case where it is set to perform the pull-down pre-emphasis operation.

A pull-down output driver which is enabled may pull-down drive the pad DQ with a third driving force corresponding to a plurality of pull-down calibration code signals DNCAL<0:5> in response to the inverted data DB. Also, a pull-down output driver which is enabled may pull-down drive the pad DQ with a fourth driving force corresponding to a plurality of pull-down pre-emphasis code signals DNEMP<0:5> in response to the pull-down pre-emphasis signal EMP_DN in the case where the second pre-emphasis control signal EMP_DN_EN is enabled. In the case where the value of the maximum driving force of the pull-down output drivers DNDRV0 to DNDRV5 is represented by DF_DN_MAX, the third driving force is represented by DF3 and the fourth driving force is represented by DF4, a relationship DFDN_MAX=DF3+DF4 may be established among the maximum driving force, the third driving force and the fourth driving force. In other words, the fourth driving force may be a driving force that is acquired by subtracting the third driving force from the maximum driving force (DF4=DF_DN_MAX−DF3).

The first pre-emphasis code generation block 1750 may generate the plurality of pull-up pre-emphasis code signals UPEMP<0:5> which have values complementary to the plurality of pull-up calibration code signals UPCAL<0:5>, in the case where the first pre-emphasis control signal EMP_UP_EN is enabled. The first pre-emphasis code generation block 1750 may generate the plurality of pull-up pre-emphasis code signals UPEMP<0:5> to a predetermined value in the case where the first pre-emphasis control signal EMP_UP_EN is disabled. The first pre-emphasis code generation block 1750 may generate the plurality of pull-up pre-emphasis code signals UPEMP<0:5> which have the value of '000000' or '111111' in the case where the first pre-emphasis control signal EMP_UP_EN is disabled.

The second pre-emphasis code generation block 1760 may generate the plurality of pull-down pre-emphasis code signals DNEMP<0:5> which have values complementary to the plurality of pull-down calibration code signals DNCAL<0:5>, in the case where the second pre-emphasis control signal EMP_DN_EN is enabled. The second pre-emphasis code generation block 1760 may generate the plurality of pull-down pre-emphasis code signals DNEMP<0:5> to a predetermined value in the case where the second pre-emphasis control signal EMP_DN_EN is disabled. The second pre-emphasis code generation block 1760 may generate the plurality of pull-down pre-emphasis code signals DNEMP<0:5> which have the value of '000000' or '111111' in the case where the second pre-emphasis control signal EMP_DN_EN is disabled.

The pre-emphasis control signal generation block 1770 may generate the first and second pre-emphasis control signals EMP_UP_EN and EMP_DN_EN in response to pre-emphasis control informations EMP_CON<0:m>.

The pre-emphasis control signal generation block 1770 may enable the first pre-emphasis control signal EMP_UP_EN in the case where the semiconductor device is set to perform the pull-up pre-emphasis operation, according to the pre-emphasis control informations EMP_CON<0:m>, and disable the first pre-emphasis control signal EMP_UP_EN in the case where the semiconductor device is set to not perform the pull-up pre-emphasis operation, according to the pre-emphasis control informations EMP_CON<0:m>.

The pre-emphasis control signal generation block 1770 may enable the second pre-emphasis control signal EMP_DN_EN in the case where the semiconductor device is set to perform the pull-down pre-emphasis operation, according to the pre-emphasis control informations EMP_CON<0:m>, and disable the second pre-emphasis control signal EMP_DN_EN in the case where the semiconductor device is set to not perform the pull-down pre-emphasis operation, according to the pre-emphasis control informations EMP_CON<0:m>.

In the case of the semiconductor device of FIG. 17, even a pull-up/pull-down output driver which is used in the data output operation may be used in the pre-emphasis operation when the driving force for performing the data output operation is smaller than the maximum driving force.

Figure 18:
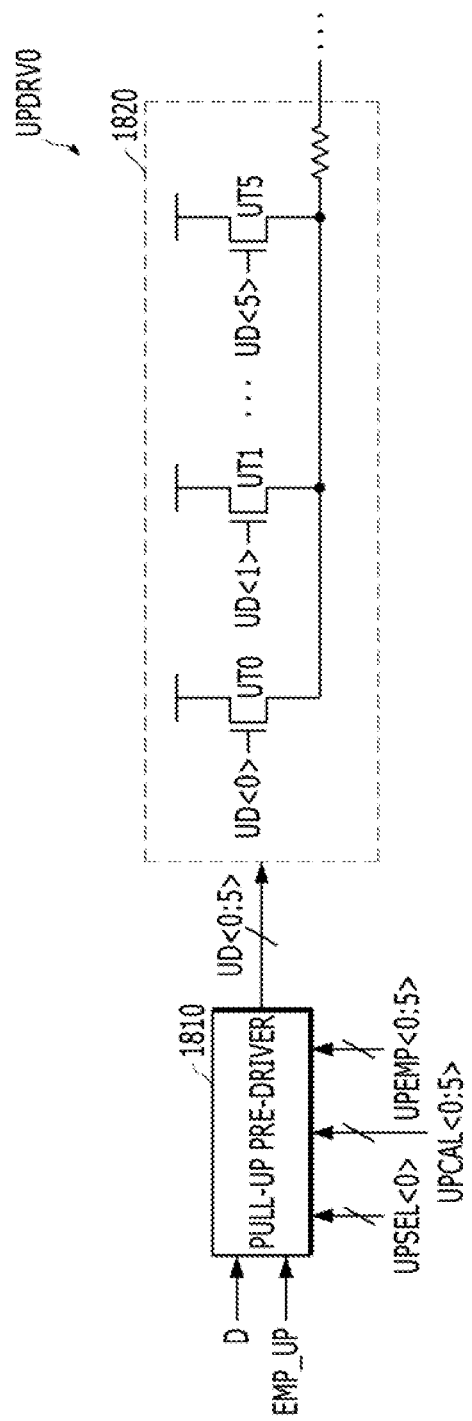
FIG. 18 is a configuration diagram illustrating a representation of an example of the pull-up output driver UPDRV0 in accordance with the embodiment.

FIG. 18 is a configuration diagram illustrating a representation of an example of the pull-up output driver UPDRV0 in accordance with the embodiment.

Referring to FIG. 18, the pull-up output driver UPDRV0 may include a pull-up pre-driver 1810 and a pull-up main driver 1820.

The pull-up pre-driver 1810 may transfer the output data D and the pull-up pre-emphasis signal EMP_UP, as a plurality of control code signals UD<0:5>, in response to the plurality of pull-up calibration code signals UPCAL<0:5> and the plurality of pull-up pre-emphasis code signals UPEMP<0:5> in the case where the pull-up output driver UPDRV0 is enabled (in the case where the pull-up selection code signal UPSEL<0> is enabled).

In the case where the pull-up selection code signal UPSEL<0> is enabled, the pull-up pre-driver 1810 may transfer the output data D as control code signals corresponding to enabled pull-up calibration code signals UPCAL<0:5> among the plurality of control code signals UD<0:5>, and transfer the pull-up pre-emphasis signal EMP_UP as control code signals corresponding to enabled pull-up pre-emphasis code signals UPEMP<0:5> among the plurality of control code signals UD<0:5>.

The pull-up main driver 1820 may include a plurality of driving transistors UT0 to UT5 each corresponding to one control code signal among the plurality of control code signals UD<0:5>, and drive the pad DQ in response to the plurality of control code signals UD<0:5>.

Each of the plurality of driving transistors UT0 to UT5 may be turned on/off in response to a control code signal corresponding thereto among the plurality of control code signals UD<0:5>. In the case where the driving transistors UT0 to UT5 are NMOS transistors, each driving transistor may be turned on when a control code signal is '1' and be turned off when a control code signal is '0.' The driving force of the pull-up output driver UPDRV0 may be changed depending upon the number of driving transistors which are turned on simultaneously and the driving force of each driving transistor which is turned on.

In the case where the semiconductor device is set to perform the pull-up pre-emphasis operation, driving transistors except driving transistors to be used in the data output operation, among the pluralities of driving transistors UT0 to UT5 of enabled pull-up output drivers, may be used in the pull-up pre-emphasis operation.

For example, in the case where the driving transistors UT0, UT2 and UT4 perform output driving in the data output operation, the driving transistors UT1, UT3 and UT5 may perform pull-up pre-emphasis driving in the pull-up pre-emphasis operation.

The pull-up output drivers UPDRV1 to UPDRV5 which are not illustrated may have the same configuration as the pull-up output driver UPDRV0, and may operate in the same manner as the pull-up output driver UPDRV0. Only pull-up selection code signals corresponding thereto may differ.

Figure 19:
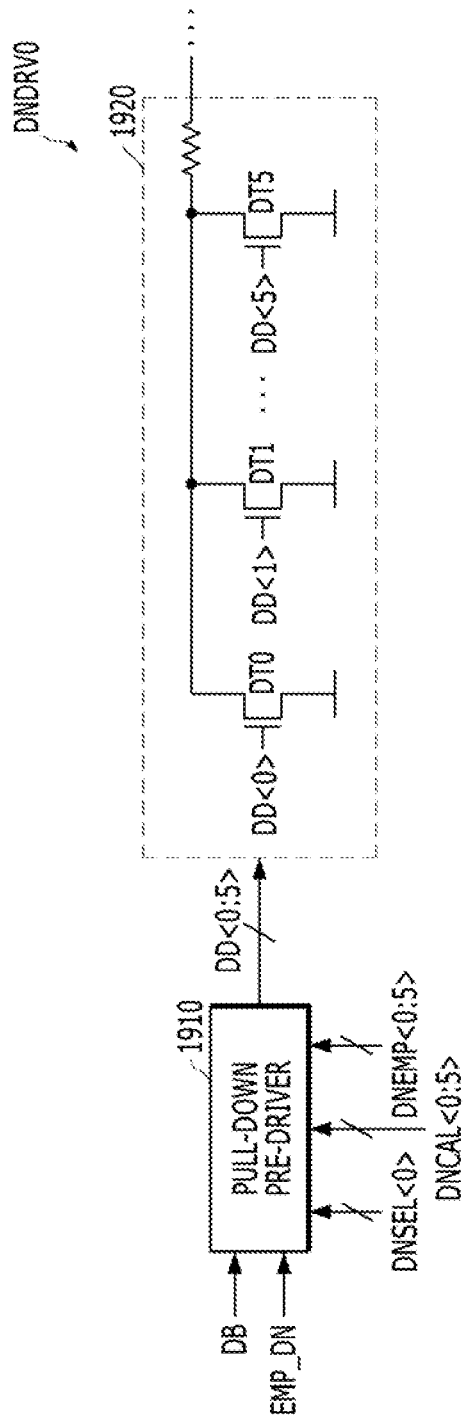
FIG. 19 is a configuration diagram illustrating a representation of an example of the pull-down output driver DNDRV0 in accordance with the embodiment.

FIG. 19 is a configuration diagram illustrating a representation of an example of the pull-down output driver DNDRV0 in accordance with the embodiment.

Referring to FIG. 19, the pull-down output driver DNDRV0 may include a pull-down pre-driver 1910 and a pull-down main driver 1920.

The pull-down pre-driver 1910 may transfer the inverted data DB and the pull-down pre-emphasis signal EMP_DN, as a plurality of control code signals DD<0:5>, in response to the plurality of pull-down calibration code signals DNCAL<0:5> and the plurality of pull-down pre-emphasis code signals DNEMP<0:5> in the case where the pull-down output driver DNDRV0 is enabled (in the case where the pull-down selection code signal DNSEL<0> is enabled).

In the case where the pull-down selection code signal DNSEL<0> is enabled, the pull-down pre-driver 1910 may transfer the inverted data DB as control code signals corresponding to enabled pull-down calibration code signals DNCAL<0:5> among the plurality of control code signals DD<0:5>, and transfer the pull-down pre-emphasis signal EMP_DN as control code signals corresponding to enabled pull-down pre-emphasis code signals DNEMP<0:5> among the plurality of control code signals DD<0:5>.

The pull-down main driver 1920 may include a plurality of driving transistors DT0 to DT5 each corresponding to one control code signal among the plurality of control code signals DD<0:5>, and drive the pad DQ in response to the plurality of control code signals DD<0:5>.

Each of the plurality of driving transistors DT0 to DT5 may be turned on/off in response to a control code signal corresponding thereto among the plurality of control code signals DD<0:5>. In the case where the driving transistors DT0 to DT5 are NMOS transistors, each driving transistor may be turned on when a control code signal is '1' and be turned off when a control code signal is '0.' The driving force of the pull-down output driver DNDRV0 may be changed depending upon the number of driving transistors which are turned on simultaneously and the driving force of each driving transistor which is turned on.

In the case where the semiconductor device is set to perform the pull-down pre-emphasis operation, driving transistors except driving transistors to be used in the data output operation, among the pluralities of driving transistors DT0 to DT5 of enabled pull-down output drivers, may be used in the pull-down pre-emphasis operation.

For example, in the case where the driving transistors DT0, DT2 and DT4 perform output driving in the data output operation, the driving transistors DT1, DT3 and DT5 may perform pull-down pre-emphasis driving in the pull-down pre-emphasis operation.

The pull-down output drivers DNDRV1 to DNDRV5 which are not illustrated may have the same configuration as the pull-down output driver DNDRV0, and may operate in the same manner as the pull-down output driver DNDRV0. Only pull-down selection code signals corresponding thereto may differ.

The configurations and the operations of the pull-up pre-driver 1810 and the pull-down pre-driver 1910 may be the same as the configuration and the operation of the pre-driver 1510.

What is claimed is:

1. A semiconductor device comprising:
a pre-emphasis control signal generation block suitable for generating first and second pre-emphasis control signals for controlling a pre-emphasis operation;
at least one first output driver suitable for being selectively enabled in response to a selection code signal and driving a pad in response to a first output signal; and
at least one second output driver suitable for being selectively enabled in response to the selection code signal and the first pre-emphasis control signal, performing the pre-emphasis operation with a driving force corresponding to a calibration code signal when the second pre-emphasis control signal is disabled, and performing the pre-emphasis operation with a maximum driving force regardless of the calibration code signal when the second pre-emphasis control signal is enabled.

2. The semiconductor device according to claim 1, wherein the second output driver drives the pad with the driving force corresponding to the calibration code signal in response to a second output signal in the case of performing the pre-emphasis operation, and drives the pad with the maximum driving force in response to the second output signal when the second pre-emphasis control signal is enabled.

3. The semiconductor device according to claim 1, wherein the first output driver comprises:
a first pre-driver suitable for generating a first control code signal in response to the selection code signal and the first output signal; and
a first main driver suitable for driving the pad in response to the first control code signal.

4. The semiconductor device according to claim 2, wherein the second output driver comprises:
a signal combination unit suitable for generating a first selection control signal in response to the selection code signal and the first pre-emphasis control signal, and generating a second selection control signal in response to the calibration code signal and the second pre-emphasis control signal;
a second pre-driver suitable for generating a second control code signal in response to the first and second selection control signals and the second output signal; and
a second main driver suitable for driving the pad in response to the second control code signal.

5. The semiconductor device according to claim 4, further comprising:
a pre-emphasis enable block suitable for generating a pre-emphasis signal which is enabled for a predetermined period, in correspondence to an edge of the first output signal; and
a selection block suitable for generating the second output signal by selecting any one of the first output signal and the pre-emphasis signal in response to the first pre-emphasis control signal.

6. The semiconductor device according to claim 5, wherein the predetermined period is shorter than 1 UI (unit interval) of the first output signal.

7. A semiconductor device comprising:
a pre-emphasis control signal generation block suitable for generating a pre-emphasis control signal; and
a plurality of output drivers suitable for being selectively enabled in response to corresponding selection code signals among a plurality of selection code signals, and performing both an output operation and a pre-emphasis operation when the pre-emphasis control signal is enabled, wherein at least one output driver which is enabled among the plurality of output drivers performs only the output operation when the pre-emphasis control signal is disabled.

8. The semiconductor device according to claim 7, wherein an output driver which is enabled among the plurality of output drivers drives the pad with a first driving force corresponding to a plurality of calibration code signals in response to output data in the output operation, and drives the pad with a second driving force that corresponds to a driving force acquired by subtracting the first driving force from a maximum driving force of the output driver, in response to a pre-emphasis signal in the pre-emphasis operation.

9. The semiconductor device according to claim 8, further comprising:
a pre-emphasis enable block suitable for generating the pre-emphasis signal which is enabled for a predetermined period that is shorter than 1 UI (unit interval) of the output data, in correspondence to an edge of the output data.

10. The semiconductor device according to claim 8, further comprising:
a pre-emphasis code generation block suitable for generating a plurality of pre-emphasis code signals which have values complementary to the plurality of calibration code signals, when the pre-emphasis control signal is enabled, the second driving force corresponding to the plurality of pre-emphasis code signals, and causing the plurality of pre-emphasis code signals to have a predetermined value when the pre-emphasis control signal is disabled.

11. The semiconductor device according to claim 10, wherein each of the plurality of output drivers comprises:
- a pre-driver suitable for transferring the output data and the pre-emphasis signal as a plurality of control code signals in response to the plurality of calibration code signals and the plurality of pre-emphasis code signals when the output driver is enabled; and
- a main driver including a plurality of driving transistors which correspond to control code signals among the plurality of control code signals, and suitable for driving the pad in response to the plurality of control code signals.

12. The semiconductor device according to claim 11, wherein the pre-driver comprises:
- a plurality of first transfer parts suitable for transferring the output data as corresponding pre-control code signals among a plurality of pre-control code signals when corresponding calibration code signals among the plurality of calibration code signals are enabled;
- a plurality of second transfer parts suitable for transferring the pre-emphasis signal as corresponding pre-control code signals among the plurality of pre-control code signals when corresponding pre-emphasis code signals among the plurality of pre-emphasis code signals are enabled; and
- a third transfer part suitable for transferring the plurality of pre-control code signals as the plurality of control code signals when a corresponding selection code signal among the plurality of selection code signals is enabled.

13. The semiconductor device according to claim 11, wherein the plurality of driving transistors are turned on/off in response to corresponding control code signals among the plurality of control code signals.

14. A semiconductor device comprising:
- a pre-emphasis control signal generation block suitable for generating first and second pre-emphasis control signals;
- a plurality of pull-up output drivers suitable for being selectively enabled in response to corresponding pull-up selection code signals among a plurality of pull-up selection code signals, and performing both a pull-up output operation and a pull-up pre-emphasis operation when the first pre-emphasis control signal is enabled, wherein at least one pull-up output driver which is enabled among the plurality of pull-up output drivers pull-up performs only the pull-up output operation when the pre-emphasis control signal is disabled; and
- a plurality of pull-down output drivers suitable for being selectively enabled in response to corresponding pull-down selection code signals among a plurality of pull-down selection code signals, and performing both a pull-down output operation and a pull-down pre-emphasis operation when the second pre-emphasis control signal is enabled, wherein at least one pull-down output driver which is enabled among the plurality of pull-down output drivers performs only the pull-down output operation when the pre-emphasis control signal is disabled.

15. The semiconductor device according to claim 14, wherein the pull-up output driver which is enabled among the plurality of pull-up output drivers pull-up drives the pad with a first driving force corresponding to a plurality of pull-up calibration code signals in response to output data in the pull-up output operation, and drives the pad with a second driving force that corresponds to a driving force acquired by subtracting the first driving force from a maximum driving force of the pull-up output driver, in response to a pull-up pre-emphasis signal in the pull-up pre-emphasis operation, and
wherein the pull-down output driver which is enabled among the plurality of pull-down output drivers pull-down drives the pad with a third driving force corresponding to a plurality of pull-down calibration code signals in response to inverted data having a phase opposite to the output data in the pull-down output operation, and drives the pad with a fourth driving force that corresponds to a driving force acquired by subtracting the third driving force from a maximum driving force of the pull-down output driver, in response to a pull-down pre-emphasis signal in the pull-down pre-emphasis operation.

16. The semiconductor device according to claim 15, further comprising:
- a first pre-emphasis enable block suitable for generating the pull-up pre-emphasis signal which is enabled for a predetermined period that is shorter than 1 UI (unit interval) of the output data, in correspondence to an edge of the output data; and
- a second pre-emphasis enable block suitable for generating the pull-down pre-emphasis signal which is enabled for a predetermined period that is shorter than 1 UI (unit interval) of the inverted data, in correspondence to an edge of the inverted data.

17. The semiconductor device according to claim 15, further comprising:
- a first pre-emphasis code generation block suitable for generating a plurality of pull-up pre-emphasis code signals which have values complementary to the plurality of pull-up calibration code signals, when the first pre-emphasis control signal is enabled, the second driving force corresponding to the plurality of pull-up pre-emphasis code signals, and causing the plurality of pull-up pre-emphasis code signals to have a predetermined value when the first pre-emphasis control signal is disabled; and
- a second pre-emphasis code generation block suitable for generating a plurality of pull-down pre-emphasis code signals which have values complementary to the plurality of pull-down calibration code signals, when the second pre-emphasis control signal is enabled, the fourth driving force corresponding to the plurality of pull-down pre-emphasis code signals, and causing the plurality of pull-down pre-emphasis code signals to have a predetermined value when the second pre-emphasis control signal is disabled.

18. The semiconductor device according to claim 17, wherein each of the plurality of pull-up output drivers comprises:
- a pull-up pre-driver suitable for transferring the output data and the pull-up pre-emphasis signal as a plurality of pull-up control code signals in response to the plurality of pull-up calibration code signals and the plurality of pull-up pre-emphasis code signals when the pull-up output driver is enabled; and
- a pull-up main driver including a plurality of driving transistors which correspond to pull-up control code signals among the plurality of pull-up control code signals, and suitable for pull-up driving the pad in response to the plurality of pull-up control code signals, and wherein each of the plurality of pull-down output drivers comprises:

a pull-down pre-driver suitable for transferring the inverted data and the pull-down pre-emphasis signal as a plurality of pull-down control code signals in response to the plurality of pull-down calibration code signals and the plurality of pull-down pre-emphasis code signals when the pull-down output driver is enabled; and a pull-down main driver including a plurality of driving transistors which correspond to pull-down control code signals among the plurality of pull-down control code signals, and suitable for pull-down driving the pad in response to the plurality of pull-down control code signals.

\* \* \* \* \*